US008994043B2

(12) United States Patent
Seo et al.

(10) Patent No.: US 8,994,043 B2
(45) Date of Patent: Mar. 31, 2015

(54) LIGHT-EMITTING ELEMENT, LIGHT-EMITTING DEVICE, DISPLAY DEVICE, ELECTRONIC DEVICE, AND LIGHTING DEVICE

(71) Applicant: Semiconductor Energy Laboratory Co., Ltd., Kanagawa-ken (JP)

(72) Inventors: Satoshi Seo, Kanagawa (JP); Nobuharu Ohsawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 114 days.

(21) Appl. No.: 13/904,450

(22) Filed: May 29, 2013

(65) Prior Publication Data
US 2013/0320368 A1    Dec. 5, 2013

(30) Foreign Application Priority Data

Jun. 1, 2012    (JP) .................................. 2012-126198

(51) Int. Cl.
*H01L 51/54*    (2006.01)
*H01L 27/32*    (2006.01)
*H01L 51/50*    (2006.01)

(52) U.S. Cl.
CPC .......... *H01L 27/3206* (2013.01); *H01L 51/504* (2013.01); *H01L 51/5036* (2013.01); *H01L 51/5024* (2013.01)
USPC .......... 257/89; 257/40; 257/E51.022; 313/506

(58) Field of Classification Search
CPC ............................................ H01L 51/00–51/56
USPC ....... 257/40, 79–103, E51.022; 313/498–512
See application file for complete search history.

(56) References Cited

U.S. PATENT DOCUMENTS

| 6,423,429 | B2 * | 7/2002 | Kido et al. ..................... 428/690 |
| 7,663,140 | B2 | 2/2010 | Yamazaki et al. |
| 7,948,163 | B2 * | 5/2011 | Parthasarathy et al. ........ 313/503 |
| 8,076,671 | B2 | 12/2011 | Yamazaki et al. |
| 8,154,192 | B2 | 4/2012 | Sakata |
| 2005/0048310 | A1 * | 3/2005 | Cocchi et al. ................. 428/690 |
| 2005/0242712 | A1 | 11/2005 | Sung |
| 2012/0153318 | A1 * | 6/2012 | Wu et al. .......................... 257/89 |
| 2012/0205632 | A1 | 8/2012 | Shitagaki et al. |
| 2012/0205684 | A1 | 8/2012 | Yamazaki et al. |
| 2012/0205687 | A1 | 8/2012 | Yamazaki et al. |

(Continued)

FOREIGN PATENT DOCUMENTS

| JP | 2005-317548 | 11/2005 |
| WO | WO 2007/029461 A1 | 3/2007 |

*Primary Examiner* — Steven J Fulk
*Assistant Examiner* — Eric Ward
(74) *Attorney, Agent, or Firm* — Husch Blackwell LLP

(57) ABSTRACT

Disclosed is a light-emitting element comprising a plurality of light-emitting units which are separated from one another by a charge generation layer. The light-emitting units each have a light-emitting layer which is featured by a stack of two layers. Each of the two layers includes a host material and a phosphorescent material where the phosphorescent material in one of the two layers is blue emissive while the phosphorescent material in the other of the two layers exhibits a maximum emission peak in a range from 500 nm to 700 nm. The phosphorescent material exhibiting a maximum emission peak in a range from 500 nm to 700 nm may be different from light-emitting unit to light-emitting unit. An additive may be included in at least one of the two layers so that an exciplex is formed with the host material.

20 Claims, 13 Drawing Sheets

(56) References Cited

U.S. PATENT DOCUMENTS

| | | |
|---|---|---|
| 2012/0206035 A1 | 8/2012 | Shitagaki et al. |
| 2012/0257382 A1 | 10/2012 | Sakata |
| 2013/0240851 A1 | 9/2013 | Seo et al. |
| 2013/0270531 A1 | 10/2013 | Seo et al. |
| 2013/0292656 A1 | 11/2013 | Seo et al. |
| 2014/0061604 A1 | 3/2014 | Seo et al. |

* cited by examiner

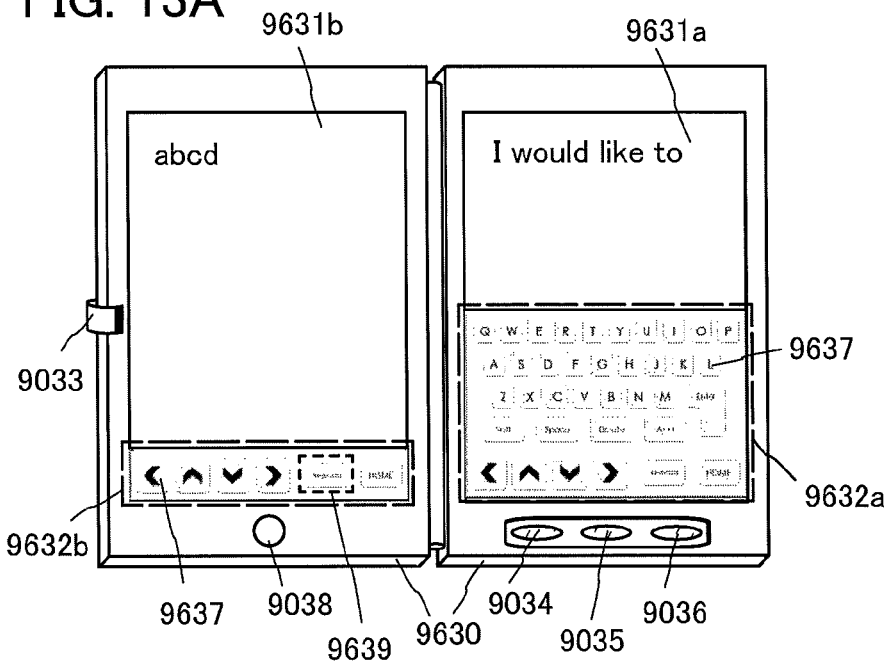
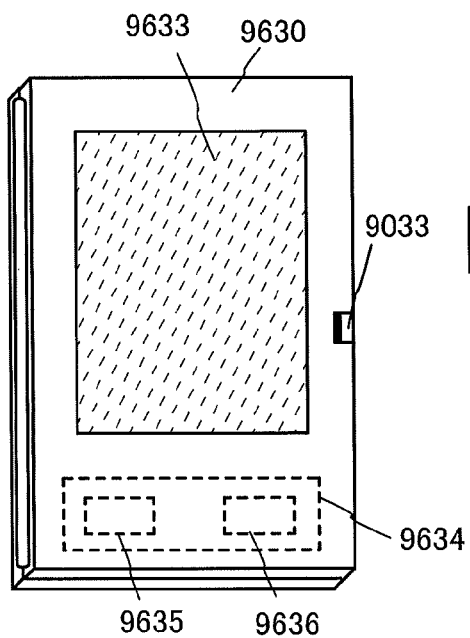
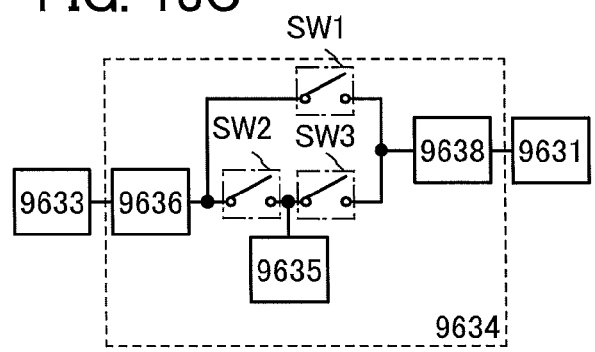

LIGHT-EMITTING ELEMENT, LIGHT-EMITTING DEVICE, DISPLAY DEVICE, ELECTRONIC DEVICE, AND LIGHTING DEVICE

BACKGROUND OF THE INVENTION

1. Field of the Invention

The present invention relates to a light-emitting element, a display device, a light-emitting device, an electronic device, and a lighting device each of which includes an organic compound as a light-emitting substance.

2. Description of the Related Art

In recent years, research and development have been extensively conducted on light-emitting elements using electroluminescence (EL). In a basic structure of such a light-emitting element, a layer containing a light-emitting substance (an EL layer) is interposed between a pair of electrodes. By applying voltage to this element, light emission from the light-emitting substance can be obtained.

Since such a light-emitting element is of self-light-emitting type, the light-emitting element has advantages over a liquid crystal display in that visibility of pixels is high, backlight is not required, and so on and is therefore suitable as flat panel display elements. In addition, it is also a great advantage that a display including such a light-emitting element can be manufactured as a thin and lightweight display. Furthermore, very high speed response is also one of the features of such an element.

Since a light-emitting layer of such a light-emitting element can be formed in the form of a film, light emission from a planar surface can be achieved. Therefore, large-area light sources can be easily formed. This feature is difficult to obtain with point light sources typified by incandescent lamps and LEDs or linear light sources typified by fluorescent lamps. Thus, light-emitting elements also have great potential as planar light sources applied to lighting devices and the like.

In the case of an organic EL element in which an EL layer containing an organic compound as the light-emitting substance is provided between a pair of electrodes, application of a voltage between the pair of electrodes causes injection of electrons from the cathode and holes from the anode into the EL layer, and thus a current flows. By recombination of the injected electrons and holes, the organic compound having a light-emitting property is excited and provides light emission from the excited state.

The excited state of an organic compound can be a singlet excited state or a triplet excited state, and light emission from the singlet excited state (S*) is referred to as fluorescence, and light emission from the triplet excited state (T*) is referred to as phosphorescence. The statistical generation ratio of the excited states in the light-emitting element is considered to be S*:T*=1:3. Therefore, a light-emitting element including a phosphorescent compound capable of converting the triplet excited state into light emission has been actively developed in recent years.

As a result, many phosphorescent substances have been developed and widely used, and red to green phosphorescent substances are already at the stage of practical use. However, blue phosphorescent substances have problems with their characteristics, especially lifetimes, and require further research and development for practical use.

Patent Document 1 discloses, as a phosphorescent compound emitting phosphorescence with a short wavelength, an iridium complex in which an imidazole derivative is a ligand.

REFERENCE

[Patent Document 1] PCT International Publication No. 2007/029461

SUMMARY OF THE INVENTION

As mentioned above, significantly shorter lifetimes of blue phosphorescent substances than those of red to green phosphorescent substances have become a problem. This interferes with the practical use of a multicolor light-emitting element with high emission efficiency. This is because, although the use of a blue phosphorescent substance is expected to increase emission efficiency drastically, it impairs lifetime significantly.

Thus, it is an object of one embodiment of the present invention to provide a multicolor light-emitting element including a blue phosphorescent substance and having a long lifetime. It is an object of another embodiment of the present invention to provide a white light-emitting element including a blue phosphorescent substance and having a long lifetime. It is also an object of one embodiment of the present invention to provide a light-emitting device, a display device, an electronic device, and a lighting device each having high reliability, with the use of the above light-emitting element.

It is only necessary that at least one of the above-described objects be achieved in the present invention.

The present invention provides a light-emitting element which includes a stack of two or more light-emitting units with a charge generation layer provided therebetween. Each unit includes a light-emitting layer containing two kinds of phosphorescent substances. At least one of the two kinds of phosphorescent substances contained in each unit has an emission maximum in a wavelength range from 400 nm to 500 nm. The other of the two kinds of phosphorescent substances has an emission maximum in a wavelength range from 500 nm to 700 nm and differs from light-emitting unit to light-emitting unit.

That is, one embodiment of the present invention is a light-emitting element which includes a pair of electrodes and an EL layer between the pair of electrodes. The EL layer includes n light-emitting layers (n is an integer greater than or equal to 2) and (n−1) charge generation layers. The m-th charge generation layer (m is an integer greater than or equal to 1 and less than or equal to n−1) is located between the m-th light-emitting layer and the (m+1)-th light-emitting layer. Each of the light-emitting layers contains two kinds of phosphorescent substances. One of the two kinds of phosphorescent substances has an emission maximum in a wavelength range from 400 nm to 500 nm, and the other has an emission maximum in a wavelength range from 500 nm to 700 nm. The phosphorescent substance having the emission maximum in the wavelength range from 500 nm to 700 nm differs from light-emitting layer to light-emitting layer in the n light-emitting layers.

Another embodiment of the present invention is a light-emitting element having the above structure, in which the phosphorescent substance having the emission maximum in the wavelength range from 400 nm to 500 nm is the same substance in all the n light-emitting layers.

Another embodiment of the present invention is a light-emitting element having the above structure, in which a peak value in the wavelength range from 400 nm to 500 nm of light emission from each of the n light-emitting layers is smaller than a peak value in the wavelength range from 500 nm to 700 nm. Specifically, it is preferable that the peak intensity of light emission from each of the n light-emitting layers in the wavelength range from 400 nm to 500 nm be more than or equal to 15% and less than or equal to 50% of the peak intensity of light emission in the wavelength from 500 nm to 700 nm.

Another embodiment of the present invention is a light-emitting element having the above structure, in which the maximum emission peak intensity of the light-emitting element in the wavelength range from 400 nm to 500 nm is more than or equal to 30% and less than 100n % of that in the wavelength range from 500 nm to 700 nm.

Another embodiment of the present invention is a light-emitting element having the above structure, in which the maximum emission peak intensity of the light-emitting element in the wavelength range from 400 nm to 500 nm is more than or equal to 30% and less than 200% of that in the wavelength range from 500 nm to 700 nm.

Another embodiment of the present invention is a light-emitting element having the above structure, in which the maximum emission peak intensity of the light-emitting element in the wavelength range from 400 nm to 500 nm is more than or equal to 30% and less than or equal to 100% of that in the wavelength range from 500 nm to 700 nm.

Another embodiment of the present invention is a light-emitting element having the above structure, in which the light-emitting element emits white light.

Another embodiment of the present invention is a light-emitting element having the above structure which gives an emission peak in each of ranges from 400 nm to 500 nm, from 500 nm to 570 nm, and from 570 nm to 700 nm.

Another embodiment of the present invention is a light-emitting element having the above structure, in which each of the light-emitting layers includes a first layer containing one of the phosphorescent compounds and a second layer containing the other of the phosphorescent compounds.

Another embodiment of the present invention is a light-emitting element having the above structure, in which n is 2 or 3.

Another embodiment of the present invention is a light-emitting device, a display device, an electronic device, and a lighting device each including a light-emitting element having the above structure.

Note that the light-emitting device in this specification includes, in its category, an image display device with a light-emitting element. Further, the category of the light-emitting device in this specification includes a module in which a light-emitting element is provided with a connector such as an anisotropic conductive film or a TCP (tape carrier package); a module in which the end of the TCP is provided with a printed wiring board; and a module in which an IC (integrated circuit) is directly mounted on a light-emitting element by a COG (chip on glass) method. Furthermore, the category includes light-emitting devices that are used in lighting equipment or the like.

One embodiment of the present invention can provide a multicolor light-emitting element including a blue phosphorescent substance and having a long lifetime. Another embodiment of the present invention can provide a white light-emitting element including a blue phosphorescent substance and having a long lifetime. One embodiment of the present invention can provide a light-emitting device, a display device, an electronic device, and a lighting device each having high reliability, with the use of the above light-emitting element.

BRIEF DESCRIPTION OF THE DRAWINGS

FIGS. 8A, 8B1, 8B2, 8C, and 8D each illustrate an electronic device.

FIGS. 13A to 13C illustrate an electronic device.

DETAILED DESCRIPTION OF THE INVENTION

Figure 1A:
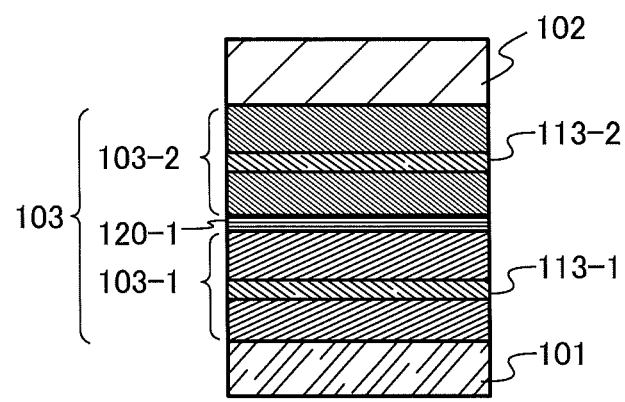
FIGS. 1A and 1B are schematic diagrams of a light-emitting element.

Embodiments of the present invention will be described below with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Embodiment 1

In a light-emitting element including an organic compound, a decrease in emission intensity with accumulation of driving time under constant current driving conditions is known to depend on initial luminance. The lifetime of the light-emitting element is defined by the time it takes for luminance to decrease from initial luminance to a certain level. That is, among light-emitting elements having the same structure, a light-emitting element which is made to emit light at a higher luminance has a shorter lifetime than a light-emitting element which is made to emit light at a lower luminance. In other words, a heavier load on a light-emitting substance (a higher probability for light emission) accelerates deterioration.

A multicolor light-emitting element typified by a white light-emitting element usually gives a plurality of emission peaks and is formed using a plurality of light-emitting substances. Their deterioration behaviors depend greatly on a light-emitting substance having the lowest resistance to the above-described load. Therefore, in a white light-emitting element including a blue phosphorescent substance which has low resistance to the above-described load, the blue phosphorescent substance is a limiting factor, and it is difficult to achieve a sufficiently long lifetime.

Thus, in one embodiment of the present invention, the above-described multicolor light-emitting element is manufactured using a light-emitting element in which a plurality of light-emitting units is stacked with a charge generation layer provided therebetween and a light-emitting layer included in each of the plurality of light-emitting units contains two kinds of phosphorescent substances. One of the two kinds of phosphorescent substances is a blue phosphorescent substance (having an emission peak in a range from 400 nm to 500 nm), and the other is a phosphorescent substance having an emission peak in a range from 500 nm to 700 nm. In addition, the phosphorescent substance having an emission peak in the range from 500 nm to 700 nm differs from light-emitting unit to light-emitting unit.

In the light-emitting element having the above structure, each light-emitting unit emits blue light. Therefore, blue light emitted from the light-emitting element as a whole has an integrated intensity of blue light from all the light-emitting units. That is, a blue light emission at an intensity necessary for the light-emitting element does not need to be provided by a single light-emitting unit; thus, the load on the blue phosphorescent substance can be reduced, and the deterioration of the blue phosphorescent substance and furthermore the deterioration of the light-emitting element can be suppressed. Note that light emitted from the light-emitting element is obtained by combining the integrated blue light emissions with light from each phosphorescent substance which differs from light-emitting unit to light-emitting unit. Note that there already exists a substance having resistance high enough to be of practical use as the phosphorescent substance having an emission peak in the range from 500 nm to 700 nm, which can satisfy a required lifetime without superimposing light as in the case of blue phosphorescence.

Figure 1B:
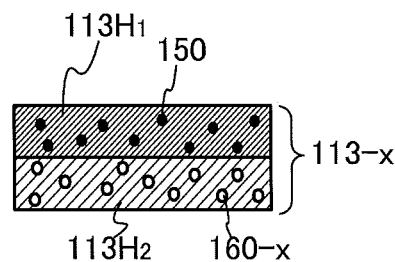

FIGS. 1A and 1B are schematic diagrams of a light-emitting element in one embodiment of the present invention. FIG. 1A illustrates a light-emitting element including a stack of two light-emitting units (a light-emitting unit 103-1 and a light-emitting unit 103-2) with a charge generation layer 120-1 provided therebetween. The light-emitting unit 103-1 includes at least a light-emitting layer 113-1, and the light-emitting unit 103-2 includes at least a light-emitting layer 113-2, and an EL layer 103 including these layers is provided between a first electrode 101 and a second electrode 102.

Although FIG. 1A shows the case where the number of light-emitting units is two, the number of light-emitting units is not limited to two. In the case where the number of light-emitting units is n (n is an integer greater than or equal to 2), there are (n−1) charge generation layers, and the m-th charge generation layer (m is an integer greater than or equal to 1 and less than or equal to n−1) is located between the m-th light-emitting unit and the (m+1)-th light-emitting unit.

An x-th light-emitting layer 113-$x$ ($x$ is an integer greater than or equal to 1 and less than or equal to n), which is typified by the light-emitting layer 113-1 that is a first light-emitting layer and the light-emitting layer 113-2 that is a second light-emitting layer, contains two kinds of phosphorescent substances. One of the two kinds of phosphorescent substances is a blue phosphorescent substance (having an emission peak in a range from 400 nm to 500 nm), and the other is a phosphorescent substance having an emission peak in a range from 500 nm to 700 nm. In addition, the phosphorescent substance having an emission peak in the range from 500 nm to 700 nm differs from light-emitting unit to light-emitting unit. Note that a light-emitting layer included in an x-th light-emitting unit is the x-th light-emitting layer and is referred to as the light-emitting layer 113-$x$.

FIG. 1B is a schematic diagram of the light-emitting layer 113-$x$ included in the x-th light-emitting unit 103-$x$. In the light-emitting layer 113-$x$ of the light-emitting element in this embodiment, it is preferable that the two kinds of phosphorescent substances exist separately in different layers as illustrated in the diagram. In the diagram, the two kinds of phosphorescent substances contained in the light-emitting layer 113-$x$ are denoted by 150 and 160-$x$, which correspond to a blue phosphorescent substance 150 (a phosphorescent substance having an emission peak in a region from 400 nm to 500 nm) and a phosphorescent substance 160-$x$ having an emission peak in a region from 500 nm to 700 nm, respectively. The blue phosphorescent substance 150 may be the same or may differ between the light-emitting layers of the light-emitting units as long as its emission peak is in the range from 400 nm to 500 nm, but is preferably the same substance because it is advantageous in integrating emission intensities. The phosphorescent substance 160-$x$ having an emission peak in the region from 500 nm to 700 nm differs between different light-emitting units. That is, the x-th light-emitting unit contains the phosphorescent substance 160-$x$, and an (x+1)-th light emitting unit contains a phosphorescent substance 160-(x+1) that is different from the phosphorescent substance 160-$x$.

It is preferable that the blue phosphorescent substance 150 and the phosphorescent substance 160-$x$ be dispersed in respective host materials. By appropriate selection of the host materials in which the substances are dispersed, the carrier-transport properties of the light-emitting layer can be adjusted and a carrier recombination region can be controlled. By controlling the recombination region, a light-emitting region can be controlled, and the emission intensity of the blue phosphorescent substance 150 can be adjusted. In addition, by controlling the emission intensity of the blue phosphorescent substance 150, a load on the blue phosphorescent substance 150 can be controlled. Accordingly, the number of light-emitting units or the intensity of blue light emission from each light-emitting layer may be determined by requirements for the intensity of blue light emission and the lifetime of the element. Note that it is preferable that an emission peak value of each light-emitting unit in a wavelength range from 400 nm to 500 nm be arranged to be smaller than that in a wavelength range from 500 nm to 700 nm, whereby the load imposed on the blue phosphorescent substance 150 can be effectively distributed and a light-emitting element having a long lifetime can be obtained. Specifically, it is preferable that the emission peak intensity of each of the n light-emitting layers in a wavelength range from 400 nm to 500 nm be more than or equal to 15% and less than or equal to 50% of that in a wavelength range from 500 nm to 700 nm. This makes it possible to achieve both favorable white light emission and high reliability in the case of stacking light-emitting units.

A carrier recombination region in a light-emitting layer can be controlled by the control of the carrier-transport properties of the light-emitting layer or the like. For example, in FIG. 1B, when a host material 113H$_1$ in which the blue phosphorescent substance 150 is dispersed has an electron-transport property and a host material 113H$_2$ in which the phosphorescent substance 160-$x$ is dispersed has a bipolar property, a main recombination region can be located in a layer in which the phosphorescent substance 160-$x$ is dispersed. Accordingly, the distance between the blue phosphorescent substance 150 and the main recombination region can be increased. Thus, the probability of light emission from the blue phosphorescent substance 150 can be decreased, and the load on the blue phosphorescent substance 150 can be reduced. Note that the carrier-transport properties of the light-emitting layer can be controlled not only by the carrier-transport properties of the host materials but also by the carrier-trapping properties of the phosphorescent substances or by addition of a third substance.

Here, the decrease of the probability of light emission from the blue phosphorescent substance 150 causes a decrease of the intensity of blue light emission from each light-emitting layer. However, in the light-emitting element in this embodiment, each of the plurality of light-emitting units contains the blue phosphorescent substance 150; thus, blue light emitted from the light-emitting element as a whole has an integrated intensity of blue light emissions from all the light-emitting units. Therefore, in the case where the number of light-emitting units is n, the load on the blue phosphorescent substance 150 for obtaining blue light emission at a desired intensity can be reduced to one n-th of normal, which contributes greatly to an increase in lifetime of the light-emitting element.

In the light-emitting element having the above structure, all light-emitting substances are phosphorescent substances. Thus, the light-emitting element can have excellent emission efficiency. In addition, light emission in a blue region at a desired intensity can be obtained with a lighter load on the blue phosphorescent substance. Thus, the light-emitting element can have a long lifetime.

The above structure can be suitably applied to a white light-emitting element. In the case of n=2, a phosphorescent substance which exhibits an emission peak (maximum) in a wavelength range from 500 nm to 570 nm that is a green region is used as a phosphorescent substance 160-1 contained in the light-emitting layer 113-1 of the first light-emitting unit, and a phosphorescent substance which exhibits an emission peak (maximum) in a wavelength range from 600 nm to 700 nm that is a red region is used as a phosphorescent substance 160-2 contained in the light-emitting layer 113-2 of the second light-emitting unit. Each unit contains the blue phosphorescent substance 150 and exhibits blue light emission (light emission having an emission peak in a range from 400 nm to 500 nm). Thus, it is possible to manufacture a white light-emitting element which is capable of producing light with a high color rendering property, whose emission spectrum has a peak in each of blue, green, and red regions. In the white light-emitting element, all light-emitting substances are phosphorescent substances. Thus, the white light-emitting element can have excellent emission efficiency. In addition, the white light-emitting element can have a long lifetime.

Note that an emission spectrum covering a wider wavelength range can be obtained by increasing the number (n) of light-emitting units, whereby a light-emitting element which is capable of producing light that is close to natural light and has a high color rendering property can be obtained.

Note that in order to obtain favorable white light emission from the white light-emitting element, it is preferable that the maximum peak intensity in a blue region (a wavelength range from 400 nm to 500 nm) be more than or equal to 30% of that in the wavelength range from 500 nm to 700 nm. In the white light-emitting element, when the maximum peak intensity in the blue region is less than 100n % of that in the wavelength range from 500 nm to 700 nm, the load on the blue phosphorescent substance 150 can be effectively distributed and the light-emitting element can have a long lifetime. Furthermore, in order to obtain a light-emitting element which has a high color temperature and needs a light load on the blue phosphorescent substance 150, it is preferable that the maximum peak intensity in the blue region be less than 200% of that in the wavelength range from 500 nm to 700 nm. In addition, when the maximum peak intensity in the blue region is less than or equal to 100% of that in the wavelength range from 500 nm to 700 nm, the light-emitting element needs a lighter load on the blue phosphorescent substance 150 and can have a longer lifetime.

A specific structure of the light-emitting element illustrated in FIGS. 1A and 1B in this embodiment will be described.

The light-emitting element includes the EL layer 103 between a pair of electrodes, i.e., the first electrode 101 and the second electrode 102, and the EL layer 103 contains phosphorescent substances.

The EL layer 103 includes the n light-emitting units (n is an integer greater than or equal to 2), and each light-emitting unit includes at least a light-emitting layer. Note that the x-th light-emitting unit (x is an integer greater than or equal to 1 and less than or equal to n) is denoted by 103-$x$; the light-emitting layer included in the x-th light-emitting unit is denoted by 113-$x$; and the phosphorescent substance contained in the x-th light-emitting unit and having a peak in a wavelength range from 500 nm to 700 nm is denoted by 160-$x$. FIG. 1A illustrates the element in the case of n=2.

The light-emitting units are stacked with a charge generation layer provided therebetween. The m-th charge generation layer is located between the m-th light-emitting unit (m is an integer greater than or equal to 1 and less than or equal to n−1) and the (m+1)-th light-emitting unit.

There is no limitation on layers other than the light-emitting layer 113-$x$ in each light-emitting unit 103-$x$, and any layer can be used; a typical stacked structure is a structure in which a hole-injection layer, a hole-transport layer, the light-emitting layer, an electron-transport layer, and an electron-injection layer are stacked in this order over the anode, or the like. Besides, a carrier-blocking layer or the like may be provided. Note that the light-emitting units 103-2 to 103-$n$ provided with a charge generation layer on the anode side do not necessarily include a hole-injection layer.

As illustrated in FIG. 1B, the light-emitting layer 113-$x$ contains at least the blue phosphorescent substance 150 and the phosphorescent substance 160-$x$ having an emission peak in a wavelength range from 500 nm to 700 nm Examples of the blue phosphorescent substance 150 include an organometallic iridium complex having a 4H-triazole skeleton, such as tris{2-[5-(2-methylphenyl)-4-(2,6-dimethylphenyl)-4H-1,2, 4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), or tris[4-(3-biphenyl)-5-isopropyl-3-phenyl-4H-1,2,4-triazolato]iridium (III) (abbreviation: Ir(iPrptz-3b)$_3$); an organometallic iridium complex having a 1H-triazole skeleton, such as tris[3-methyl-1-(2-methylphenyl)-5-phenyl-1H-1,2,4-triazolato]iridium (III) (abbreviation: Ir(Mptz1-mp)$_3$) or tris(1-methyl-5-phenyl-3-propyl-1H-1,2,4-triazolato)iridium(III) (abbreviation: Ir(Prptz1-Me)$_3$); an organometallic iridium complex having an imidazole skeleton, such as fac-tris[1-(2,6-diisopropylphenyl)-2-phenyl-1H-imidazole]iridium(III) (abbreviation: Ir(iPrpmi)$_3$), or tris[3-(2,6-dimethylphenyl)-7-methylimidazo[1,2-f]phenanthridinato]iridium(III) (abbreviation: Ir(dmpimpt-Me)$_3$); and an organometallic iridium complex in which a phenylpyridine derivative having an electron-withdrawing group is a ligand, such as bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium (III) picolinate (abbreviation: Ir(CF$_3$ ppy)$_2$(pic)), or bis[2-(4', 6'-difluorophenyl)pyridinato-N,C$^{2'}$]iridium(III) acetylacetonate (abbreviation: FIr(acac)). Note that an organometallic iridium complex having a 4H-triazole skeleton has excellent reliability and emission efficiency and thus is especially preferable.

As the phosphorescent substance 160-$x$ having an emission peak in the wavelength range from 500 nm to 700 nm, a variety of phosphorescent substances can be used. Examples of phosphorescent substances having an emission peak in a range from 500 nm to 600 nm include an organometallic iridium complex having a pyrimidine skeleton, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[6-(2-norbornyl)-4-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), or (acetylacetonato)bis(4,6-diphenylpyrimidinato)iridium(III) (abbreviation: Ir(dppm)$_2$(acac)); an organometallic iridium complex having a pyrazine skeleton, such as (acetylacetonato)bis(3,5-dimethyl-2-phenylpyrazinato)iridium(III) (abbreviation: Ir(mppr-Me)$_2$(acac)) or (acetylacetonato)bis(5-isopropyl-3-methyl-2-phenylpyrazinato)iridium(III) (abbreviation: Ir(mppr-iPr)$_2$(acac)); an organometallic iridium complex having a pyridine skeleton, such as tris(2-phenylpyridinato-N,C$^{2'}$)iridium(III) (abbreviation: Ir(ppy)$_3$) or bis(2-phenylpyridinato-N,C$^{2'}$)iridium(III) acetylacetonate (abbreviation: Ir(ppy)$_2$(acac)); an organometallic iridium complex having a quinoline skeleton, such as bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N, C$^{2'}$)iridium(III) (abbreviation: Ir(pq)$_3$), or bis(2-phenylquinolinato-N,C$^{2'}$)iridium(III) acetylacetonate (abbreviation: Ir(pq)$_2$(acac)); and a rare earth metal complex such as tris(acetylacetonato)(monophenanthroline)terbium(III) (abbreviation: Tb(acac)$_3$(Phen)). Note that an organometallic iridium complex having a pyrimidine skeleton has distinctively high reliability and emission efficiency and thus is especially preferable. Examples of red phosphorescent substances having an emission peak in a range from 600 nm to 700 nm include an organometallic iridium complex having a pyrimidine skeleton, such as bis[4,6-bis(3-methylphenyl)pyrimidinato](diisobutylylmethano)iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), or bis[4,6-di(naphthalen-1-yl)pyrimidinato](dipivaloylmethanato)iridium(III) (abbreviation: Ir(d1npm)$_2$(dpm)); an organometallic iridium complex having a pyrazine skeleton, such as (acetylacetonato)bis(2,3,5-triphenylpyrazinato)iridium(III) (abbreviation: Ir(tppr)$_2$(acac)) or bis(2,3,5-triphenylpyrazinato)(dipivaloylmethanato)iridium(III) (abbreviation: Ir(tppr)$_2$(dpm)); an organometallic iridium complex having a quinoxaline skeleton, such as (acetylacetonato)bis[2,3-bis(4-fluorophenyl)quinoxalinato]iridium(III) (abbreviation: Ir(Fdpq)$_2$(acac)); an organometallic iridium complex having a isoquinoline skeleton, such as tris(1-phenylisoquinolinato-N,C$^{2'}$)iridium(III) (abbreviation: Ir(piq)$_3$) or bis(1-phenylisoquinolinato-N, C$^{2'}$) iridium(III)acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and a rare earth metal complex such as tris(1,3-diphenyl-1,3-propanedionato)(monophenanthroline)europium(III) (abbreviation: Eu(DBM)$_3$(Phen)) or tris[1-(2-thenyl)-3,3,3-trifluoroacetonato](monophenanthroline)europium(III) (abbreviation: Eu(TTA)$_3$(Phen)). Note that an organometallic iridium complex having a pyrimidine skeleton has distinctively high reliability and emission efficiency and thus is especially preferable. Further, because an organometallic iridium complex having a pyrazine skeleton can provide red light emission with favorable chromaticity, the use of the organometallic iridium complex in a white light-emitting element improves a color rendering property of the white light-emitting element.

The phosphorescent substances may be selected from known phosphorescent substances as well as from the above phosphorescent compounds.

There is no particular limitation on the materials which can be used as the host materials in which the blue phosphorescent substance 150 and the phosphorescent substance 160-$x$ are dispersed; a variety of carrier-transport materials may be used. Note that the light-emitting layer 113-$x$ has a stack of a layer containing the blue phosphorescent substance 150 (first layer) and a layer containing the phosphorescent substance 160-$x$ (second layer) so that the emission intensity of blue phosphorescence can be adjusted. When the carrier-transport properties of the first layer and the second layer are adjusted such that a carrier recombination region is located in the second layer, the intensity of blue light emission can be kept low, and at the same time, sufficient light emission from the phosphorescent substance 160-$x$ can be obtained. The recombination region can be located in the second layer by the following methods: a method in which materials having an electron-transport property are used as both the host material 113H$_1$ in the first layer and the host material 113H$_2$ in the second layer, and a substance having a hole-trapping property is added to the second layer (or the phosphorescent substance 160-$x$ having a hole-transport property may be used); a method in which materials having a hole-transport property are used as the host materials 113H$_1$ and 113H$_2$ and a substance having an electron-trapping property is added to the second layer (or the phosphorescent substance 160-$x$ having an electron-trapping property may be used); a method in which a material having an electron-transport property is used as the host material 113H$_1$ in the first layer and a material having a bipolar property is used as the host material 113H$_2$ in the second layer; and the like. However, the present invention is not limited to these methods. Note that, as mentioned above, a carrier transport property of a layer may be affected by not only a carrier-transport property of a host material but also a phosphorescent substance or other additives.

Examples of materials which can be used as the above host materials or additives are given below. The following are examples of materials having an electron-transport property: a metal complex such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having a polyazole skeleton such as 2-(4-biphenyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11); a heterocyclic compound having a benzimidazole skeleton such as 2,2',2''-(1,3,5-benzenetriyl)tris(1-phenyl-1H-benzimidazole) (abbreviation: TPBI) or 2-[3-(dibenzothiophen-4-yl)phenyl]-1-phenyl-1H-benzimidazole (abbreviation: mDBTBIm-II); a heterocyclic compound having a quinoxaline skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), or 2-[3'-(9H-carbazol-9-yl)biphenyl-3-yl]dibenzo[f,h]quinoxaline (abbreviation: 2mCzBPDBq); a heterocyclic compound having a diazine skeleton such as 4,6-bis[3-(phenanthren-9-yl)phenyl]pyrimidine (abbreviation: 4,6mPnP2 Pm), or 4,6-bis[3-(4-dibenzothienyl)phenyl]pyrimidine (abbreviation: 4,6mDBTP2 Pm-II); and a heterocyclic compound having a pyridine skeleton such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB). Among the above materials, a heterocyclic compound having a diazine skeleton and a heterocyclic compound having a pyridine skeleton have high reliability and are thus preferable. Specifically, a heterocyclic compound having a diazine (pyrimidine or pyrazine) skeleton has a high electron-transport property to contribute to a reduction in drive voltage.

The following are examples of materials having a hole-transport property: a compound having an aromatic amine skeleton such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(Spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton such as 4,4',4''-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, a compound having an aromatic amine skeleton and a compound having a carbazole skeleton are preferable because these compounds are highly reliable and have high hole-transport properties to contribute to a reduction in drive voltage.

The host materials may be selected from known substances as well as from the above host materials. Note that as the host materials, substances having a triplet level (energy gap between a ground state and a triplet excited state) higher than that of the phosphorescent substances are preferably selected. The light-emitting layer may contain a third substance in addition to the host materials and the phosphorescent substances which are main components of the light-emitting element. Note that this statement does not exclude the possibility that the light-emitting layer contains a component other than the host materials, the phosphorescent substances, and the third substance.

Here, for obtaining a light-emitting element having high emission efficiency, energy transfer between the host material and the phosphorescent substance will be considered. Carrier recombination occurs in both the host material and the phosphorescent substance; thus, efficient energy transfer from the host material to the phosphorescent substance is needed to increase emission efficiency.

As mechanisms of the energy transfer from the host material to the phosphorescent substance, two mechanisms have been proposed: one is Dexter mechanism, and the other is Förster mechanism. Each mechanism is described below. Here, a molecule providing excitation energy is referred to as a host molecule, while a molecule receiving the excitation energy is referred to as a guest molecule.

<<Förster Mechanism (Dipole-Dipole Interaction)>>

Förster mechanism (also referred to as Förster resonance energy transfer) does not require direct contact between molecules for energy transfer. Through a resonant phenomenon of dipolar oscillation between a host molecule and a guest molecule, energy transfer occurs. By the resonant phenomenon of dipolar oscillation, the host molecule provides energy to the guest molecule, and thus, the host molecule returns to a ground state and the guest molecule reaches an excited state. The rate constant $k_{h^* \to g}$ of Förster mechanism is expressed by Formula (1).

[Formula 1]

$$k_{h^* \to g} = \frac{9000 c^4 K^2 \phi \ln 10}{128 \pi^5 n^4 N \tau R^6} \int \frac{f_h'(\nu) \varepsilon_g(\nu)}{\nu^4} d\nu \quad (1)$$

In Formula (1), $\nu$ denotes a frequency, $f_h'(\nu)$ denotes a normalized emission spectrum of a host molecule (a fluorescent spectrum in energy transfer from a singlet excited state, and a phosphorescent spectrum in energy transfer from a triplet excited state), $\varepsilon_g(\nu)$ denotes a molar absorption coefficient of a guest molecule; N denotes Avogadro's number, n denotes a refractive index of a medium, R denotes an intermolecular distance between the host molecule and the guest molecule, $\tau$ denotes a measured lifetime of an excited state (fluorescence lifetime or phosphorescence lifetime), c denotes the speed of light, $\phi$ denotes a luminescence quantum yield (a fluorescence quantum yield in energy transfer from a singlet excited state, and a phosphorescence quantum yield in energy transfer from a triplet excited state), and $K^2$ denotes a coefficient (0 to 4) of orientation of a transition dipole moment between the host molecule and the guest molecule. Note that $K^2 = 2/3$ in random orientation.

<<Dexter Mechanism (Electron Exchange Interaction)>>

In Dexter mechanism (also referred to as Dexter electron transfer), a host molecule and a guest molecule are close to a contact effective range where their orbitals can overlap, and the host molecule in an excited state and the guest molecule in a ground state exchange their electrons, which leads to energy transfer. The rate constant $k_{h^* \to g}$ of Dexter mechanism is expressed by Formula (2).

[Formula 2]

$$k_{h^* \to g} = \left(\frac{2\pi}{h}\right) K^2 \exp\left(-\frac{2R}{L}\right) \int f_h'(\nu) \varepsilon_g'(\nu) d\nu \quad (2)$$

In Formula (2), h denotes a Planck constant, K denotes a constant having an energy dimension, $\nu$ denotes a frequency, $f_h'(\nu)$ denotes a normalized emission spectrum of a host molecule (a fluorescent spectrum in energy transfer from a singlet excited state, and a phosphorescent spectrum in energy transfer from a triplet excited state), $\epsilon'_g(\nu)$ denotes a normalized absorption spectrum of a guest molecule, L denotes an effective molecular radius, and R denotes an intermolecular distance between the host molecule and the guest molecule.

Here, the efficiency of energy transfer from the host molecule to the guest molecule (energy transfer efficiency $\Phi_{ET}$) is expressed by Formula (3). In the formula, $k_r$ denotes a rate constant of a light-emission process (fluorescence in energy transfer from a singlet excited state, and phosphorescence in energy transfer from a triplet excited state), $k_n$ denotes a rate constant of a non-light-emission process (thermal deactivation or intersystem crossing), and $\tau$ denotes a measured lifetime of an excited state.

[Formula 3]

$$\Phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad (3)$$

First, according to Formula (3), it is understood that the energy transfer efficiency $\Phi_{ET}$ can be increased by significantly increasing the rate constant $k_{h^* \to g}$ of energy transfer as compared with another competing rate constant $k_r + k_n$ ($=1/\tau$). Then, in order to increase the rate constant $k_{h^* \to g}$ of energy transfer, based on Formulae (1) and (2), in Förster mechanism and Dexter mechanism, it is preferable that an emission spectrum of a host molecule (a fluorescent spectrum in energy transfer from a singlet excited state, and a phosphorescent spectrum in energy transfer from a triplet excited state) largely overlap with an absorption spectrum of a guest molecule.

Here, the inventors found that the absorption band on the longest wavelength side (lowest energy side) in the absorption spectrum of the guest molecule is of great importance in considering the overlap between the emission spectrum of the host molecule and the absorption spectrum of the guest molecule.

In this embodiment, a phosphorescent compound is used as the guest material. In an absorption spectrum of the phosphorescent compound, an absorption band that is considered to contribute to light emission most greatly is at an absorption wavelength corresponding to direct transition from a ground state to a triplet excitation state and a vicinity of the absorption wavelength, which is on the longest wavelength side. From these considerations, the inventors conceived that it is preferable to control the emission spectrum (a fluorescent spectrum and a phosphorescent spectrum) of the host material so as to overlap with the absorption band on the longest wavelength side in the absorption spectrum of the phosphorescent compound.

For example, most organometallic complexes, especially light-emitting iridium complexes, have a broad absorption band at around 500 nm to 600 nm as the absorption band on the longest wavelength side. This absorption band is mainly based on a triplet MLCT (metal to ligand charge transfer) transition. Note that it is considered that the absorption band also includes absorptions based on a triplet π-π* transition and a singlet MLCT transition, and that these absorptions overlap each other to form a broad absorption band on the longest wavelength side in the absorption spectrum. Therefore, the inventors propose that, when an organometallic complex (especially iridium complex) is used as the guest material, it is preferable to make the broad absorption band on the longest wavelength side largely overlap with the emission spectrum of the host material as described above.

Here, first, energy transfer from a host material in a triplet excited state will be considered. From the above-described discussion, it is preferable that, in energy transfer from a triplet excited state, the phosphorescent spectrum of the host material and the absorption band on the longest wavelength side of the guest material largely overlap each other.

However, a question here is energy transfer from the host molecule in the singlet excited state. In order to efficiently perform not only energy transfer from the triplet excited state but also energy transfer from the singlet excited state, it is clear from the above-described discussion that the host material needs to be designed such that not only its phosphorescent spectrum but also its fluorescent spectrum overlaps with the absorption band on the longest wavelength side of the guest material. In other words, unless the host material is designed so as to have its fluorescent spectrum in a position similar to that of its phosphorescent spectrum, it is not possible to achieve efficient energy transfer from the host material in both the singlet excited state and the triplet excited state.

However, in general, the $S_1$ level differs greatly from the $T_1$ level ($S_1$ level>$T_1$ level); therefore, the fluorescence emission wavelength also differs greatly from the phosphorescence emission wavelength (fluorescence emission wavelength<phosphorescence emission wavelength). For example, CBP, which is commonly used in a light-emitting element including a phosphorescent compound, has a phosphorescent spectrum at around 500 nm and has a fluorescent spectrum at around 400 nm, which are largely different by about 100 nm. This example also shows that it is extremely difficult to design a host material so as to have its fluorescent spectrum in a position similar to that of its phosphorescent spectrum.

Fluorescence is emitted from an energy level higher than that of phosphorescence, and the $T_1$ level of a host material whose fluorescence spectrum corresponds to a wavelength close to an absorption spectrum of a guest material on the longest wavelength side is lower than the $T_1$ level of the guest material.

Thus, it is preferable that the light-emitting element in this embodiment include a third substance in the light-emitting layer in addition to the host material and the phosphorescent substance and a combination of the host material and the third substance form an exciplex. In that case, at the time of recombination of carriers (electrons and holes) in the light-emitting layer, the host material and the third substance form an exciplex. A fluorescence spectrum of the exciplex is on a longer wavelength side than a fluorescence spectrum of the host material alone or the third substance alone. Therefore, energy transfer from a singlet excited state can be maximized while the $T_1$ levels of the host material and the third substance are kept higher than the $T_1$ level of the guest material. In addition, the exciplex is in a state where the $T_1$ level and the $S_1$ level are close to each other; therefore, the fluorescence spectrum and the phosphorescence spectrum exist at substantially the same position. Accordingly, both the fluorescence spectrum and the phosphorescence spectrum of the exciplex can overlap largely with an absorption corresponding to transition of the guest molecule from the singlet ground state to the triplet excited state (a broad absorption band of the guest molecule existing on the longest wavelength side), and thus a light-emitting element having high energy transfer efficiency can be obtained.

As the third substance, the above material which can be used as the host material or additives can be used. There is no particular limitation on the host materials and the third substance as long as they can form an exciplex; a combination of a compound which is likely to accept electrons (a compound having an electron-trapping property) and a compound which is likely to accept holes (a compound having a hole-trapping property) is preferably employed.

Note that in the case where a compound which is likely to accept electrons and a compound which is likely to accept holes are used for the host material and the third substance, carrier balance can be controlled by the mixture ratio of the compounds. Specifically, the ratio of the host material to the third substance is preferably from 1:9 to 9:1.

The light-emitting layer 113-x having the above-described structure can be formed by a co-evaporation method, or an inkjet method, a spin coating method, a dip coating method, or the like using a mixed solution.

The light-emitting element having the above-described structure has high energy transfer efficiency and high emission efficiency.

Embodiment 2

In this embodiment, a detailed example of the structure of the light-emitting element described in Embodiment 1 will be described below with reference to FIGS. 1A and 1B.

A light-emitting element in this embodiment includes, between a pair of electrodes, the EL layer 103 including a plurality of layers. In this embodiment, the light-emitting element includes the first electrode 101, the second electrode 102, and the EL layer 103 which is provided between the first electrode 101 and the second electrode 102, and the EL layer 103 includes n light-emitting units (n is an integer greater than or equal to 2) and (n−1) charge generation layers. Note that FIGS. 1A and 1B illustrate the case of n=2 and therefore illustrate a first light-emitting unit 103-1, a second light-emitting unit 103-2, and a first charge generation layer 120-1. The following description is made on the assumption that the first electrode 101 functions as an anode and that the second electrode 102 functions as a cathode. In other words, when a voltage is applied between the first electrode 101 and the second electrode 102 so that the potential of the first electrode 101 is higher than that of the second electrode 102, light emission can be obtained.

Since the first electrode 101 functions as the anode, the first electrode 101 is preferably formed using any of metals, alloys, electrically conductive compounds with a high work function (specifically, a work function of 4.0 eV or more), mixtures thereof, and the like. Specifically, for example, indium oxide-tin oxide (ITO: indium tin oxide), indium oxide-tin oxide containing silicon or silicon oxide, indium oxide-zinc oxide, indium oxide containing tungsten oxide and zinc oxide (IWZO), and the like can be given. Films of these electrically conductive metal oxides are usually formed by a sputtering method but may be formed by application of a sol-gel method or the like. In an example of the formation method, indium oxide-zinc oxide is deposited by a sputtering method using a target obtained by adding 1 wt % to 20 wt % of zinc oxide to indium oxide. Further, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Besides, gold (Au), platinum (Pt), nickel (Ni), tungsten (W), chromium (Cr), molybdenum (Mo), iron (Fe), cobalt (Co), copper (Cu), palladium (Pd), nitrides of metal materials (e.g., titanium nitride), and the like can be given. Graphene can also be used. Note that when a composite material described later is used for a layer which is in contact with the first electrode 101 in the EL layer 103, an electrode material can be selected regardless of its work function.

There is no particular limitation on the stacked-layer structure of the light-emitting unit 103-x as long as the light-emitting layer 113-x has the structure described in Embodiment 1. For example, the light-emitting unit 103-x can be formed by combining a hole-injection layer, a hole-transport layer, the light-emitting layer, an electron-transport layer, an electron-injection layer, a carrier-blocking layer, an intermediate layer, and the like as appropriate. Specific examples of materials used for each layer are given below.

The hole-injection layer is a layer containing a substance having a high hole-injection property. Molybdenum oxide, vanadium oxide, ruthenium oxide, tungsten oxide, manganese oxide, or the like can be used. Alternatively, the hole-injection layer can be formed using a phthalocyanine-based compound such as phthalocyanine (abbreviation: $H_2Pc$) or copper phthalocyanine (abbreviation: CuPc), an aromatic amine compound such as 4,4'-bis[N-(4-diphenylaminophenyl)-N-phenylamino]biphenyl (abbreviation: DPAB) or {4-[bis(3-methylphenyl)amino]phenyl}-N,N'-diphenyl-(1,1'-biphenyl)-4,4'-diamine (abbreviation: DNTPD), a high molecular compound such as poly(ethylenedioxythiophene)/poly(styrenesulfonic acid) (abbreviation: PEDOT/PSS), or the like.

Alternatively, a composite material in which a substance having a hole-transport property contains a substance having an acceptor property can be used for the hole-injection layer. Note that the use of such a substance having a hole-transport property which contains a substance having an acceptor property enables selection of a material used to form an electrode regardless of its work function. In other words, besides a material having a high work function, a material having a low work function can also be used for the first electrode 101. As the substance having an acceptor property, 7,7,8,8-tetracyano-2,3,5,6-tetrafluoroquinodimethane (abbreviation: $F_4$-TCNQ), chloranil, and the like can be given. In addition, transition metal oxides can be given. Oxides of the metals that belong to Groups 4 to 8 of the periodic table can be given. Specifically, vanadium oxide, niobium oxide, tantalum oxide, chromium oxide, molybdenum oxide, tungsten oxide, manganese oxide, and rhenium oxide are preferable in that their electron-accepting property is high. Among these oxides, molybdenum oxide is particularly preferable in that it is stable in the air, has a low hygroscopic property, and is easy to handle.

As the substance having a hole-transport property which is used for the composite material, any of a variety of organic compounds such as aromatic amine compounds, carbazole derivatives, aromatic hydrocarbons, and high molecular compounds (e.g., oligomers, dendrimers, or polymers) can be used. Note that the organic compound used for the composite material is preferably an organic compound having a high hole-transport property. Specifically, a substance having a hole mobility of $10^{-6}$ $cm^2/Vs$ or more is preferably used. Organic compounds that can be used as the substance having a hole-transport property in the composite material are specifically given below.

Examples of the aromatic amine compounds are N,N'-di (p-tolyl)-N,N'-diphenyl-p-phenylenediamine (abbreviation: DTDPPA), DPAB, DNTPD, 1,3,5-tris[N-(4-diphenylaminophenyl)-N-phenylamino]benzene (abbreviation: DPA3B), and the like.

Specific examples of the carbazole derivatives that can be used for the composite material are 3-[N-(9-phenylkarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenyl-carbazole (abbreviation: PCzPCN1), and the like.

Other examples of the carbazole derivatives that can be used for the composite material are CBP, 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbons that can be used for the composite material are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, or the like can also be used. The aromatic hydrocarbon which has a hole mobility of $1\times10^{-6}$ cm$^2$/Vs or more and which has 14 to 42 carbon atoms is particularly preferable.

Note that the aromatic hydrocarbons that can be used for the composite material may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

A polymeric compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), or poly[N,N'-bis(4-butylphenyl)-N,N'-bis(phenyl)benzidine] (abbreviation: poly-TPD) can also be used.

By providing a hole-injection layer, a high hole-injection property can be achieved to allow a light-emitting element to be driven at a low voltage.

The hole-transport layer is a layer that contains a substance having a hole-transport property. Examples of the substance having a hole-transport property are aromatic amine compounds such as NPB, TPD, 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), BSPB, BPAFLP, and the like. The substances mentioned here have high hole-transport properties and are mainly ones that have a hole mobility of $10^{-6}$ cm$^2$/Vs or more. An organic compound given as an example of the substance having a hole-transport property in the composite material described above can also be used for the hole-transport layer. A polymeric compound such as PVK or PVTPA can also be used. Note that the layer that contains a substance having a hole-transport property is not limited to a single layer, and may be a stack of two or more layers including any of the above substances.

The light-emitting layer 113-x has the structure described in Embodiment 1. Therefore, the light-emitting element in this embodiment can have extremely high emission efficiency. Embodiment 1 is to be referred to for the components of the light-emitting layer 113-x.

The light-emitting layer 113-x having the above-described structure can be formed by a co-evaporation method, or an inkjet method, a spin coating method, a dip coating method, or the like.

The electron-transport layer is a layer containing a substance having an electron-transport property. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), BeBq$_2$, or BAlq, or the like can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used. Besides the metal complexes, PBD, OXD-7, TAZ, bathophenanthroline (abbreviation: BPhen), bathocuproine (abbreviation: BCP), or the like can also be used. The substances mentioned here have high electron-transport properties and are mainly ones that have an electron mobility of $10^{-6}$ cm$^2$/Vs or more. Note that any of the above-described host materials having electron-transport properties may be used for the electron-transport layer.

The electron-transport layer is not limited to a single layer, and may be a stack of two or more layers containing any of the above substances.

Between the electron-transport layer and the light-emitting layer, a layer that controls transport of electron carriers may be provided. This is a layer formed by addition of a small amount of a substance having a high electron-trapping property to the aforementioned materials having a high electron-transport property, and the layer is capable of adjusting carrier balance by retarding transport of electron carriers. Such a structure is very effective in preventing a problem (such as a reduction in element lifetime) caused when electrons pass through the light-emitting layer.

In addition, the electron-injection layer may be provided in contact with the second electrode 102. For the electron-injection layer, an alkali metal, an alkaline earth metal, or a compound thereof, such as lithium fluoride (LiF), cesium fluoride (CsF), or calcium fluoride (CaF$_2$), can be used. For example, a layer that is formed using a substance having an electron-transport property and contains an alkali metal, an alkaline earth metal, or a compound thereof can be used. Note that a layer that is formed using a substance having an electron-transport property and contains an alkali metal or an alkaline earth metal is preferably used as the electron-injection layer, in which case electron injection from the second electrode 102 is efficiently performed.

The charge generation layer can be formed using the above composite material in which a substance having a hole-transport property contains a substance having an acceptor property. Further, the charge generation layer may have a stacked structure including a layer containing the composite material and a layer containing another material. In that case, as the layer containing another material, a layer containing a donor substance and a substance having a high electron-transport property, a layer containing a light-transmitting conductive metal oxide, or the like can be used.

For the second electrode 102, any of metals, alloys, electrically conductive compounds, and mixtures thereof which have a low work function (specifically, a work function of 3.8 eV or less) or the like can be used. Specific examples of such a cathode material are elements belonging to Groups 1 and 2 of the periodic table, such as alkali metals (e.g., lithium (Li)

and cesium (Cs)), magnesium (Mg), calcium (Ca), and strontium (Sr), alloys thereof (e.g., MgAg and AlLi), rare earth metals such as europium (Eu) and ytterbium (Yb), alloys thereof, and the like. However, when the electron-injection layer is provided between the second electrode 102 and the electron-transport layer, for the second electrode 102, any of a variety of conductive materials such as Al, Ag, ITO, or indium oxide-tin oxide containing silicon or silicon oxide can be used regardless of the work function. Films of these electrically conductive materials can be formed by a sputtering method, an inkjet method, a spin coating method, or the like.

Any of a variety of methods can be used to form the EL layer 103 regardless whether it is a dry process or a wet process. For example, a vacuum evaporation method, an inkjet method, a spin coating method, or the like may be used. Different formation methods may be used for the electrodes or the layers.

In addition, the electrode may be formed by a wet method using a sol-gel method, or by a wet method using paste of a metal material. Alternatively, the electrode may be formed by a dry method such as a sputtering method or a vacuum evaporation method.

In the light-emitting element having the above-described structure, current flows due to a potential difference applied between the first electrode 101 and the second electrode 102, and holes and electrons recombine in the light-emitting layer 113-$x$ which contains a light-emitting substance, so that light is emitted. That is, a light-emitting region is formed in the light-emitting layer 113-$x$.

Light emission is extracted out through one or both of the first electrode 101 and the second electrode 102. Therefore, one or both of the first electrode 101 and the second electrode 102 are light-transmitting electrodes. In the case where only the first electrode 101 is a light-transmitting electrode, light emission is extracted through the first electrode 101. In the case where only the second electrode 102 is a light-transmitting electrode, light emission is extracted through the second electrode 102. In the case where both the first electrode 101 and the second electrode 102 are light-transmitting electrodes, light emission is extracted through the first electrode 101 and the second electrode 102.

The structure of the layers provided between the first electrode 101 and the second electrode 102 is not limited to the above-described structure. Preferably, a light-emitting region where holes and electrons recombine is positioned away from the first electrode 101 and the second electrode 102 so that quenching due to the proximity of the light-emitting region and a metal used for electrodes and carrier-injection layers can be prevented.

Further, in order that transfer of energy from an exciton generated in the light-emitting layer can be suppressed, preferably, the hole-transport layer and the electron-transport layer which are in contact with the light-emitting layer 113-$x$, particularly a carrier-transport layer in contact with a side closer to the light-emitting region in the light-emitting layer 113-$x$, are formed using a substance having a wider band gap than the light-emitting substance of the light-emitting layer or the emission center substance included in the light-emitting layer.

The light-emitting element in this embodiment is provided over a substrate of glass, plastic, a metal, or the like. As a substrate which transmits light from the light-emitting element, a substrate having a high visible light transmitting property is used.

As the way of stacking layers over the substrate, layers may be sequentially stacked from the first electrode 101 side or sequentially stacked from the second electrode 102 side. In a light-emitting device, although one light-emitting element may be formed over one substrate, a plurality of light-emitting elements may be formed over one substrate. With a plurality of light-emitting elements as described above formed over one substrate, a lighting device in which elements are separated or a passive-matrix light-emitting device can be manufactured. A light-emitting element may be formed over an electrode electrically connected to a thin film transistor (TFT), for example, which is formed over a substrate of glass, plastic, or the like, so that an active matrix light-emitting device in which the TFT controls the drive of the light-emitting element can be manufactured. Note that there is no particular limitation on the structure of the TFT, which may be a staggered TFT or an inverted staggered TFT. In addition, crystallinity of a semiconductor used for the TFT is not particularly limited either; an amorphous semiconductor or a crystalline semiconductor may be used. In addition, a driver circuit formed in a TFT substrate may be formed with an n-type TFT and a p-type TFT, or with either an n-type TFT or a p-type TFT.

Note that this embodiment can be combined with any of the other embodiments as appropriate.

Embodiment 3

In this embodiment, a light-emitting device including the light-emitting element described in Embodiment 1 or 2 will be described.

Figure 3A:
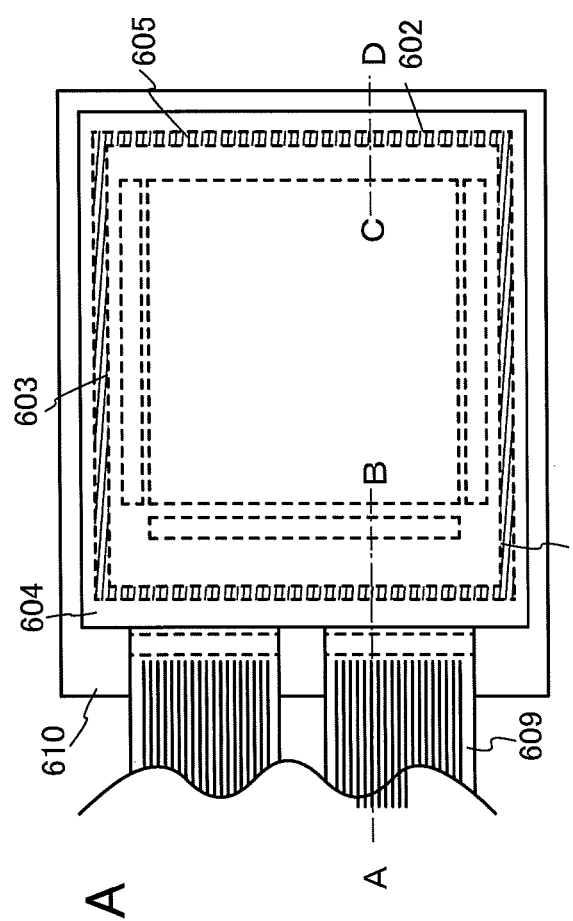
FIGS. 3A and 3B are schematic diagrams of an active matrix light-emitting device.
Figure 3B:
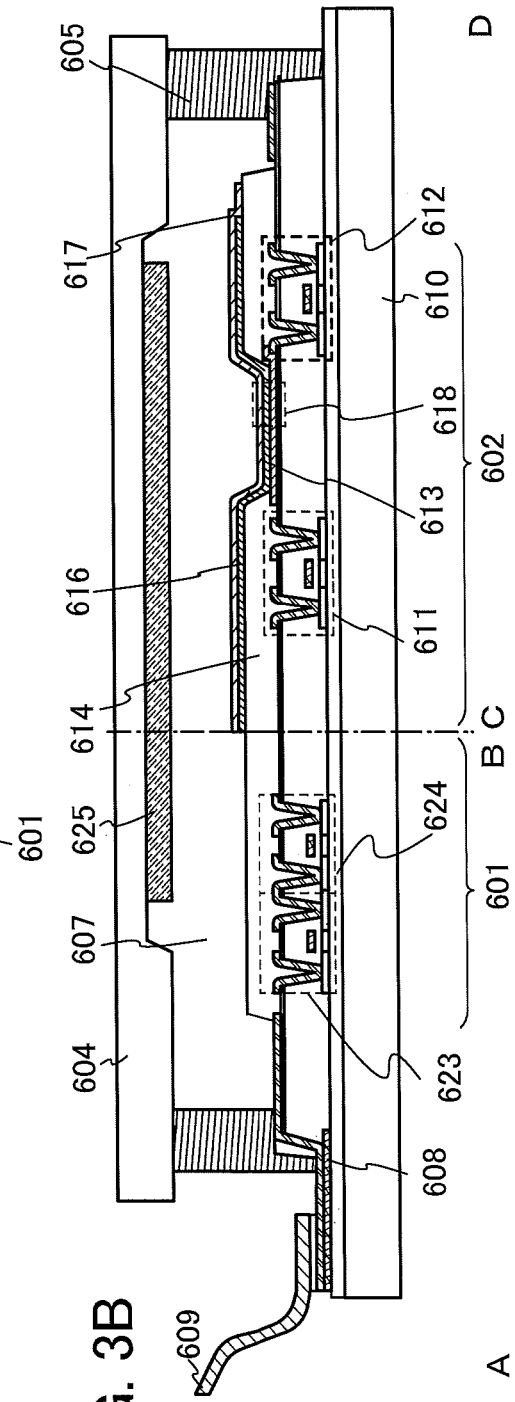

In this embodiment, the light-emitting device manufactured using the light-emitting element described in Embodiment 1 or 2 is described with reference to FIGS. 3A and 3B. Note that FIG. 3A is a top view of the light-emitting device and FIG. 3B is a cross-sectional view taken along the lines A-B and C-D in FIG. 3A. This light-emitting device includes a driver circuit portion (source line driver circuit) 601, a pixel portion 602, and a driver circuit portion (gate line driver circuit) 603, which are to control light emission of a light-emitting element 618 and illustrated with dotted lines. A reference numeral 604 denotes a sealing substrate; 625, a drying agent; 605, a sealing material; and 607, a space surrounded by the sealing material 605.

Reference numeral 608 denotes a wiring for transmitting signals to be input to the source line driver circuit 601 and the gate line driver circuit 603 and receiving signals such as a video signal, a clock signal, a start signal, and a reset signal from an FPC (flexible printed circuit) 609 serving as an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

The driver circuit portion and the pixel portion are formed over an element substrate 610; FIG. 3B shows the source line driver circuit 601, which is a driver circuit portion, and one of the pixels in the pixel portion 602.

As the source line driver circuit 601, a CMOS circuit in which an n-channel TFT 623 and a p-channel TFT 624 are combined is formed. In addition, the driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside, not over the substrate.

The pixel portion 602 includes a plurality of pixels including a switching TFT 611, a current controlling TFT 612, and a first electrode 613 electrically connected to a drain of the current controlling TFT 612. Note that to cover an end portion of the first electrode 613, an insulator 614 is formed, for which a positive photosensitive acrylic resin film is used here.

In order to improve coverage, the insulator 614 is formed to have a curved surface with curvature at its upper or lower end portion. For example, in the case where positive photosensitive acrylic is used for a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has the structure described in Embodiment 1 or 2. Further, for another material included in the EL layer 616, any of low molecular-weight compounds and polymeric compounds (including oligomers and dendrimers) may be used.

As a material used for the second electrode 617, which is formed over the EL layer 616 and functions as a cathode, a material having a low work function (e.g., Al, Mg, Li, Ca, or an alloy or a compound thereof, such as MgAg, MgIn, or AlLi) is preferably used. In the case where light generated in the EL layer 616 is extracted through the second electrode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the light-emitting element 618 is formed with the first electrode 613, the EL layer 616, and the second electrode 617. The light-emitting element has the structure described in Embodiment 2. In the light-emitting device of this embodiment, the pixel portion 602, which includes a plurality of light-emitting elements, may include both the light-emitting element described in Embodiment 1 or 2 and a light-emitting element having a different structure.

The sealing substrate 604 is attached to the element substrate 610 with the sealing material 605, so that the light-emitting element 618 is provided in the space 607 surrounded by the element substrate 610, the sealing substrate 604, and the sealing material 605. The space 607 may be filled with filler, or may be filled with an inert gas (such as nitrogen or argon), or the sealing material 605. It is preferable that the sealing substrate be provided with a recessed portion and the drying agent 625 be provided in the recessed portion, in which case deterioration due to influence of moisture can be suppressed.

An epoxy-based resin or glass fit is preferably used for the sealing material 605. It is preferable that such a material do not transmit moisture or oxygen as much as possible. As the sealing substrate 604, a glass substrate, a quartz substrate, or a plastic substrate formed of fiberglass reinforced plastic (FRP), poly(vinyl fluoride) (PVF), polyester, acrylic, or the like can be used.

As described above, the light-emitting device which uses the light-emitting element described in Embodiment 1 or 2 can be obtained.

The light-emitting device in this embodiment is fabricated using the light-emitting element described in Embodiment 1 or 2 and thus can have favorable characteristics. Specifically, since the light-emitting element described in Embodiment 1 or 2 has high emission efficiency, the light-emitting device can have reduced power consumption.

Figure 4A:
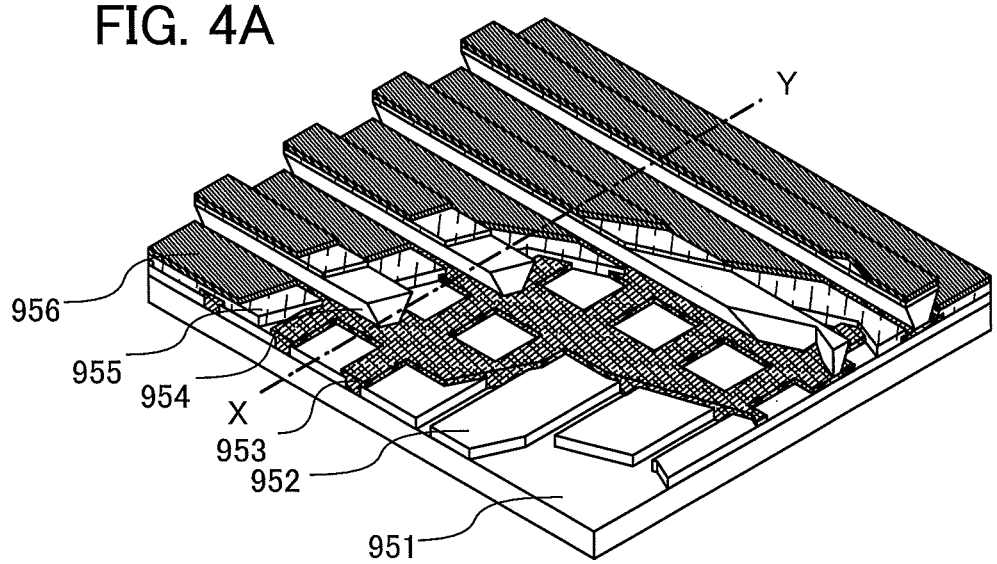
FIGS. 4A and 4B are schematic diagrams of a passive matrix light-emitting device.
Figure 4B:
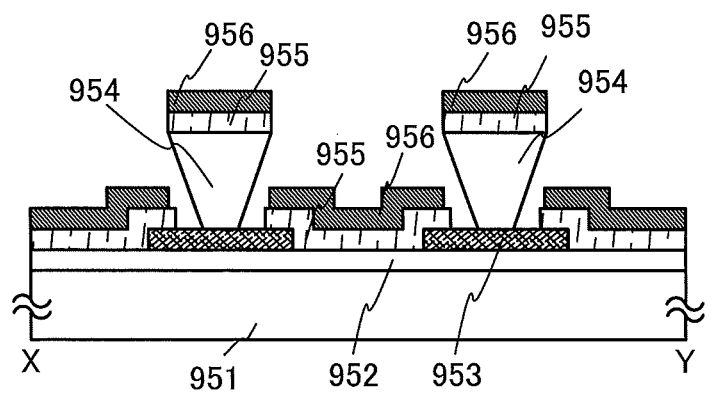

Although an active matrix light-emitting device is described above in this embodiment, application to a passive matrix light-emitting device may be carried out. FIGS. 4A and 4B illustrate a passive matrix light-emitting device manufactured using the present invention. FIG. 4A is a perspective view of the light-emitting device, and FIG. 4B is a cross-sectional view taken along the line X-Y in FIG. 4A. In FIGS. 4A and 4B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side which is in contact with the insulating layer 953) is shorter than the upper side (a side which is not in contact with the insulating layer 953). The partition layer 954 thus provided can prevent defects in the light-emitting element due to crosstalk or the like. The passive matrix light-emitting device can also be driven with low power consumption by including the light-emitting element in Embodiment 1 or 2 which has high emission efficiency.

Figure 5A:
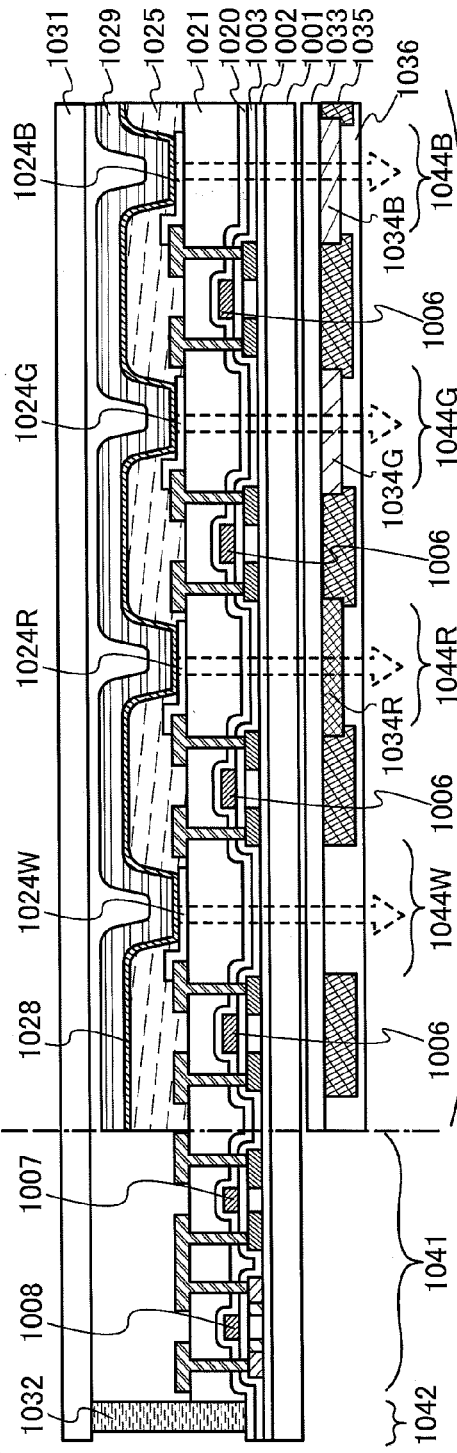
FIGS. 5A and 5B are schematic diagrams of an active matrix light-emitting device.
Figure 5B:
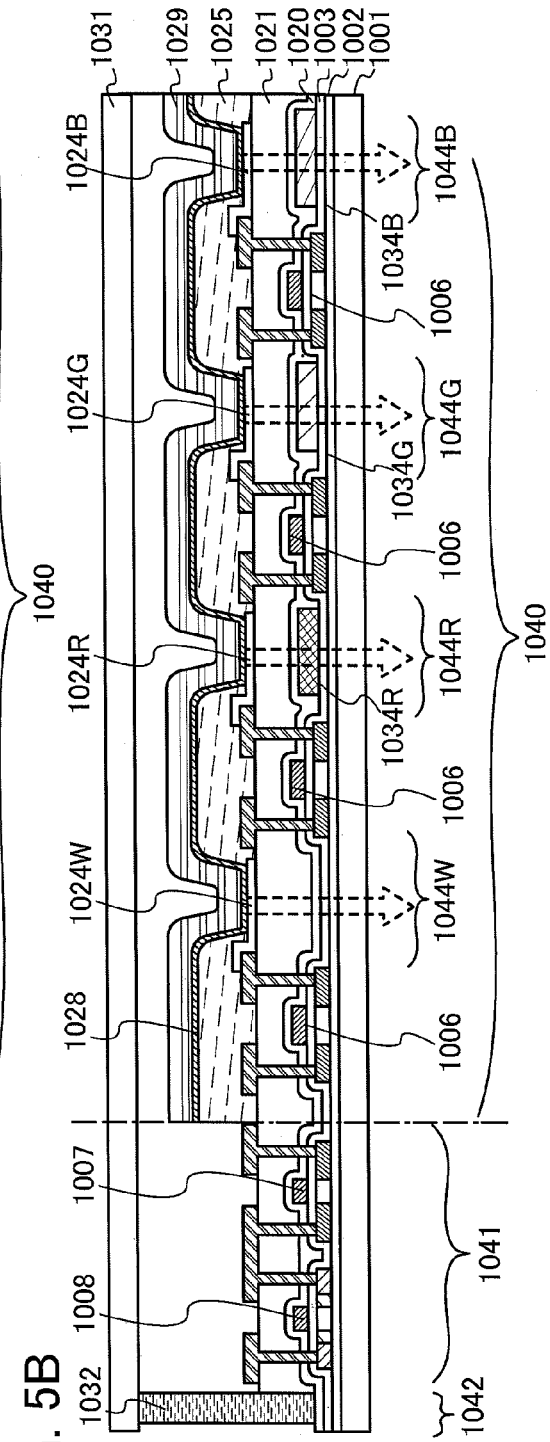

For performing full color display, a coloring layer or a color conversion layer may be provided in a light path through which light from the light-emitting element passes to the outside of the light-emitting device. An example of a light-emitting device in which full color display is achieved with the use of a coloring layer and the like is illustrated in FIGS. 5A and 5B. In FIG. 5A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G and 1024B of light-emitting elements, a partition 1025, an EL layer 1028, a second electrode 1029 of the light-emitting elements, a sealing substrate 1031, a sealant 1032, and the like are illustrated. Further, coloring layers (a red coloring layer 1034, a green coloring layer 1034G and a blue coloring layer 1034B) are provided on a transparent base material 1033. Further, a black layer (a black matrix) 1035 may be additionally provided. The transparent base material 1033 provided with the coloring layers and the black layer is fixed to the substrate 1001. Note that the coloring layers and the black layer are covered with an overcoat layer 1036. In this embodiment, light emitted from part of the light-emitting layer does not pass through the coloring layers, while light emitted from the other part of the light-emitting layer passes through the coloring layers. Since light which does not pass through the coloring layers is white and light which passes through any one of the coloring layers is red, blue, or green, a full color image can be displayed using pixels of the four colors.

Figure 6:
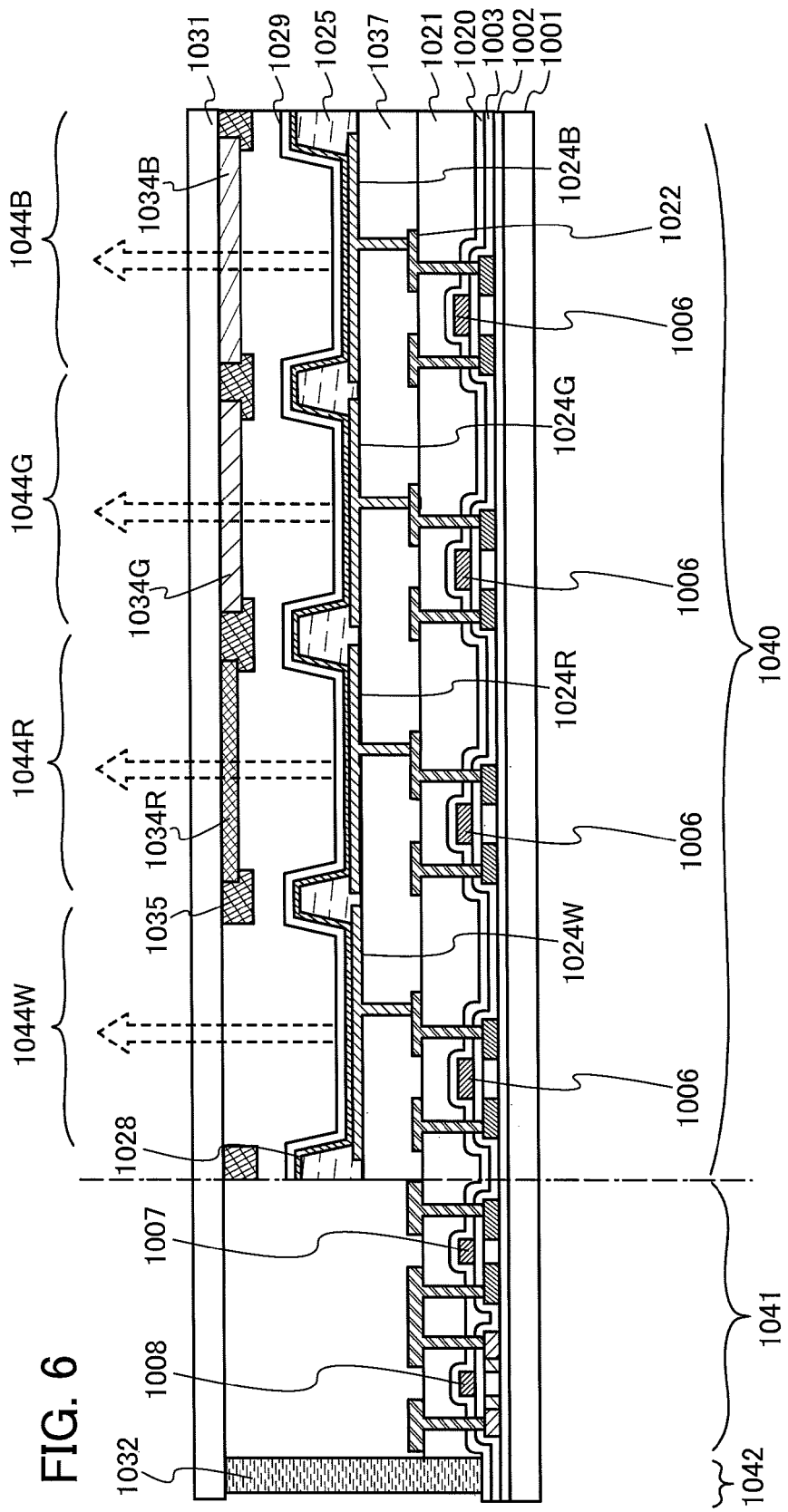
FIG. 6 is a schematic diagram of an active matrix light-emitting device.

The above-described light-emitting device is a light-emitting device having a structure in which light is extracted from the substrate 1001 side where the TFTs are formed (a bottom emission structure), but may be a light-emitting device having a structure in which light is extracted from the sealing substrate 1031 side (a top emission structure). FIG. 6 is a cross-sectional view of a light-emitting device having a top emission structure. In this case, a substrate which does not transmit light can be used as the substrate 1001. Apart from the structure illustrated in FIG. 5A, a third interlayer insulating film 1037 is formed to cover an electrode 1022. This insulating film may have a planarization function.

The first electrodes 1024W, 1024R, 1024G and 1024B of the light-emitting elements each serve as an anode here, but may serve as a cathode. The first electrodes are reflective electrodes. The EL layer 1028 is formed to have the structure described in Embodiment 1 or 2, with which white light emission can be obtained.

The coloring layers are each provided in a light path through which light from the light-emitting element passes to the outside of the light-emitting device. In the case of the light-emitting device having a bottom emission structure as illustrated in FIG. 5A, the coloring layers 1034R, 1034G and 1034B can be provided on the transparent base material 1033 and then fixed to the substrate 1001. The coloring layers may be provided between the gate insulating film 1003 and the first interlayer insulating film 1020 as illustrated in FIG. 5B. In the case of a top emission structure as illustrated in FIG. 6, sealing can be performed with the sealing substrate 1031 on which the coloring layers (the red coloring layer 1034R, the green coloring layer 1034G and the blue coloring layer 1034B) are provided. The sealing substrate 1031 may be provided with a black layer 1035 which is positioned between pixels. The coloring layers (the red coloring layer 1034R, the green coloring layer 1034G, and the blue coloring layer 1034B) and the black layer 1035 may be covered with an overcoat layer 1036. Note that a light-transmitting substrate is used as the sealing substrate 1031.

The light-emitting device in this embodiment provides blue emission by superimposing blue phosphorescent emissions from a plurality of light-emitting units, which makes it possible to reduce deterioration of a light-emitting element itself due to deterioration of a blue phosphorescent substance. In addition, blue pixels require only a small amount of current for providing blue light emission at a desired luminance, which contributes to a reduction of power consumption.

When voltage is applied between the pair of electrodes of the thus obtained organic light-emitting element, a white light-emitting region 1044W can be obtained. In addition, by using the coloring layers, a red light-emitting region 1044R, a blue light-emitting region 1044B, and a green light-emitting region 1044G can be obtained. The light-emitting device in this embodiment includes the light-emitting element described in Embodiment 1 or 2; thus, a light-emitting device with low power consumption can be obtained.

Although an example in which full color display is performed using four colors of red, green, blue, and white is shown here, there is no particular limitation and full color display using three colors of red, green, and blue may be performed.

This embodiment can be freely combined with any of other embodiments.

Embodiment 4

Figure 7A:
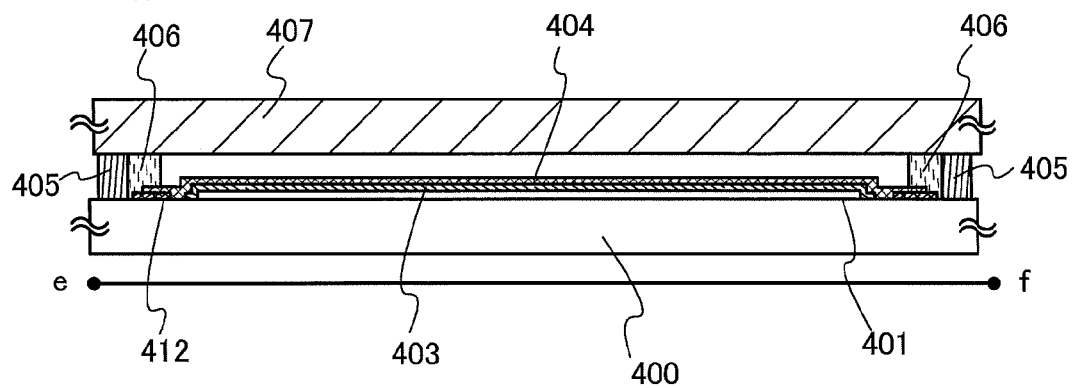
FIGS. 7A and 7B are schematic diagrams of a lighting device.
Figure 7B:
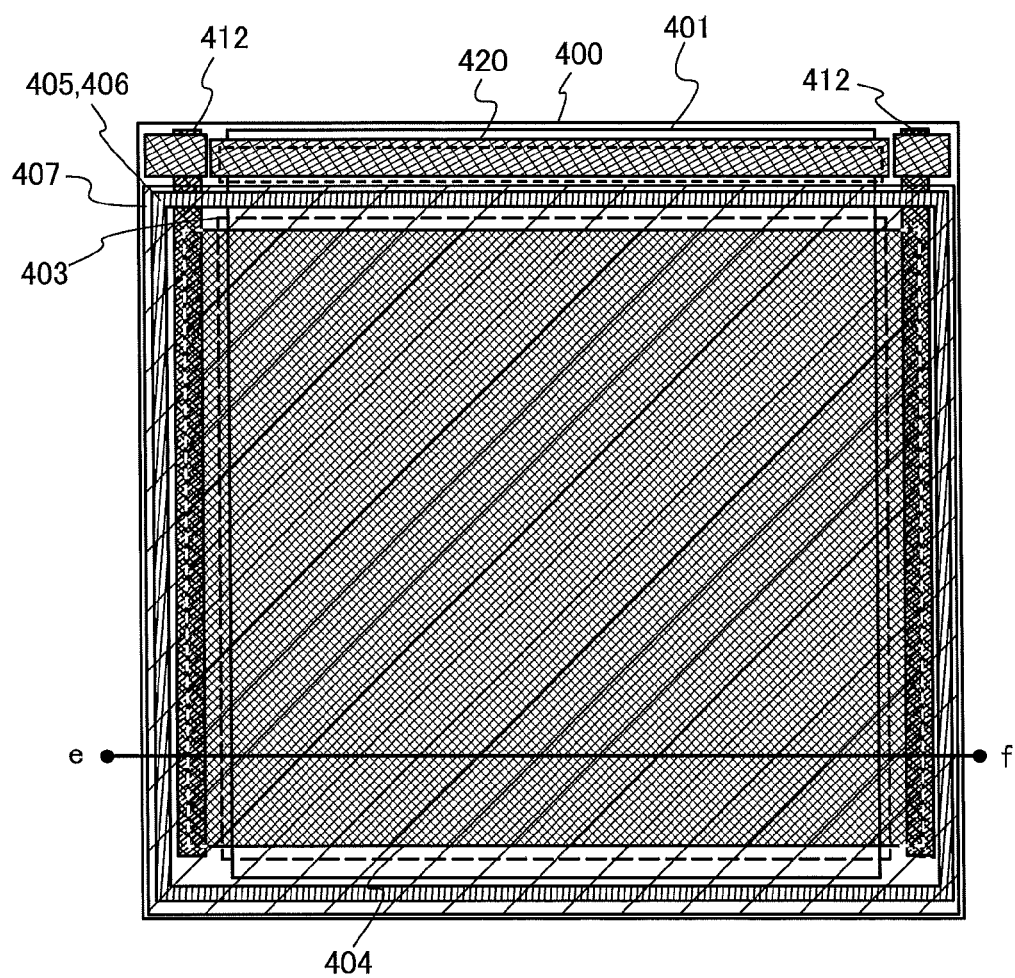

In this embodiment, an example in which the light-emitting element described in Embodiment 1 or 2 is used for a lighting device will be described with reference to FIGS. 7A, 7B, FIG. 10, and FIG. 11. FIG. 7B is a top view of the lighting device, and FIG. 7A is a cross-sectional view taken along the line e-f in FIG. 7B.

In the lighting device in this embodiment, a first electrode 401 is formed over a substrate 400 which is a support and has a light-transmitting property. The first electrode 401 corresponds to the first electrode 101 in Embodiment 1 or 2. When light is extracted through the first electrode 401 side, the first electrode 401 is formed using a material having a light-transmitting property.

A pad 412 for applying voltage to a second electrode 404 is provided over the substrate 400.

An EL layer 403 is formed over the first electrode 401. The EL layer 403 has the structure described in Embodiment 1 or 2. Refer to the descriptions for the structure.

The second electrode 404 is formed to cover the EL layer 403. The second electrode 404 corresponds to the second electrode 102 in Embodiment 1 or 2. The second electrode 404 is formed using a material having high reflectance when light is extracted through the first electrode 401 side. The second electrode 404 is connected to the pad 412, whereby voltage is applied.

As described above, the lighting device described in this embodiment includes a light-emitting element including the first electrode 401, the EL layer 403, and the second electrode 404. Since the light-emitting element is a light-emitting element with high emission efficiency, the lighting device in this embodiment can be a lighting device having low power consumption. Furthermore, since the light-emitting element has high reliability, the lighting device in this embodiment can be a lighting device having high reliability.

The light-emitting element having the above structure is fixed to a sealing substrate 407 with sealing materials 405 and 406 and sealing is performed, whereby the lighting device is completed. It is possible to use only either the sealing material 405 or the sealing material 406. The inner sealing material 406 (not shown in FIG. 7B) can be mixed with a desiccant which enables moisture to be adsorbed, increasing reliability.

When parts of the pad 412 and the first electrode 401 are extended to the outside of the sealing materials 405 and 406, the extended parts can serve as external input terminals. An IC chip 420 mounted with a converter or the like may be provided over the external input terminals.

Figure 10:
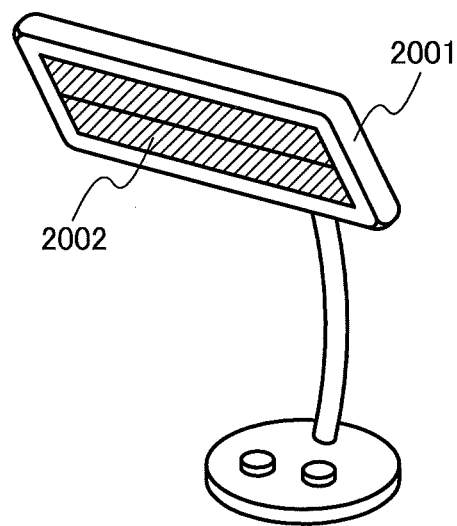
FIG. 10 illustrates a lighting device.

FIG. 10 illustrates a table lamp as an example of a lighting device. The table lamp includes a housing 2001 and a light source 2002, and the light-emitting device described in this embodiment is used for the light source 2002.

Figure 11:
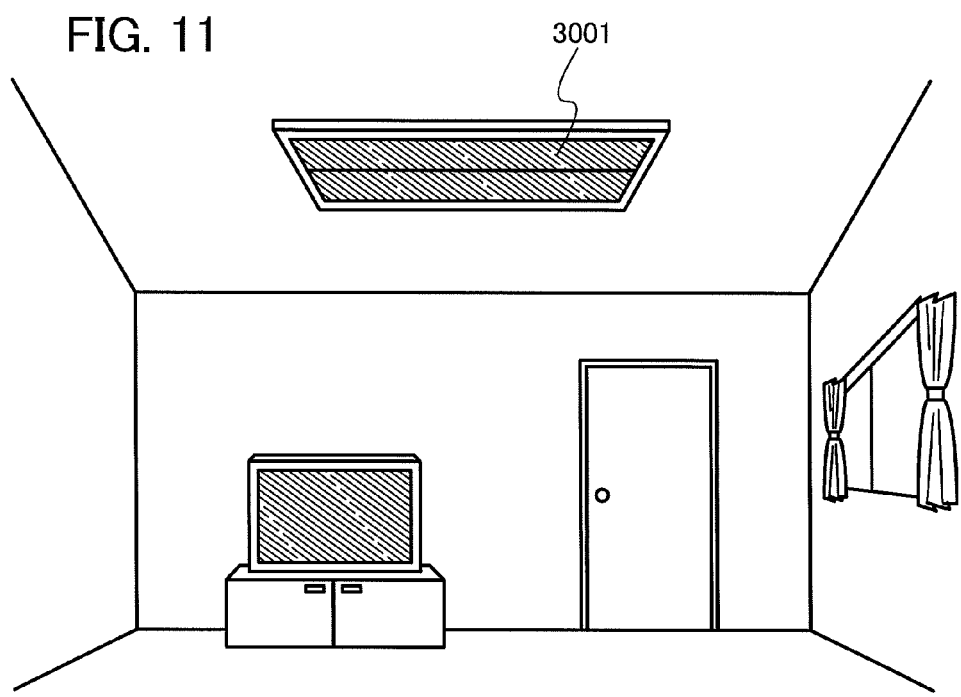
FIG. 11 illustrates a lighting device.

FIG. 11 illustrates an example in which the light-emitting element described in Embodiment 1 or 2 is used for an indoor lighting device 3001.

As described above, since the lighting device described in this embodiment includes the light-emitting element described in Embodiment 1 or 2, the lighting device can have low power consumption. Furthermore, since the light-emitting element exhibits high reliability, the lighting device in this embodiment can be a lighting device having high reliability. Additionally, since the light-emitting element described in Embodiment 1 or 2 can be manufactured as a thin light-emitting element having a large area, a lighting device having a large area and a small thickness can be obtained.

Embodiment 5

In this embodiment, examples of electronic devices each including the light-emitting element described in Embodiment 1 or 2 will be described. The light-emitting element described in Embodiment 1 or 2 has high emission efficiency and reduced power consumption. As a result, the electronic devices described in this embodiment can each include a light-emitting portion having reduced power consumption.

Examples of the electronic device to which the above light-emitting element is applied include television devices (also referred to as TV or television receivers), monitors for computers and the like, cameras such as digital cameras and digital video cameras, digital photo frames, mobile phones (also referred to as cell phones or mobile phone devices), portable game machines, portable information terminals, audio playback devices, large game machines such as pachinko machines, and the like. Specific examples of these electronic devices are given below.

Figure 8A:
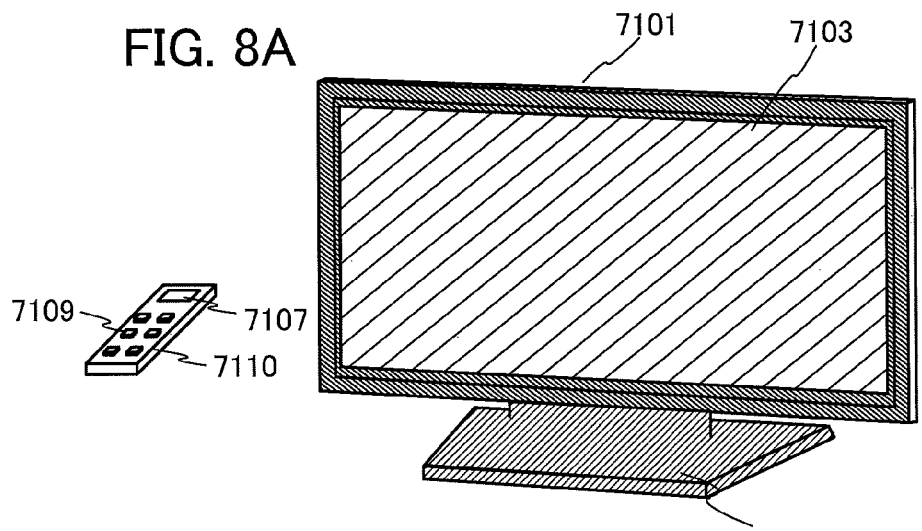
Figure 8A:
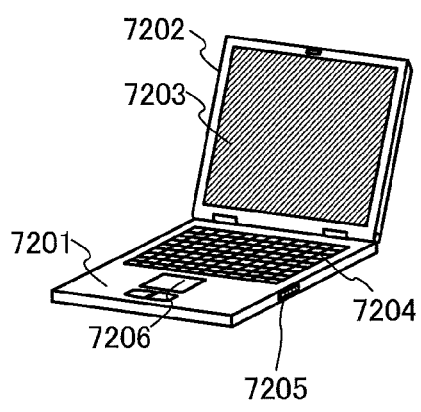
Figure 8A:
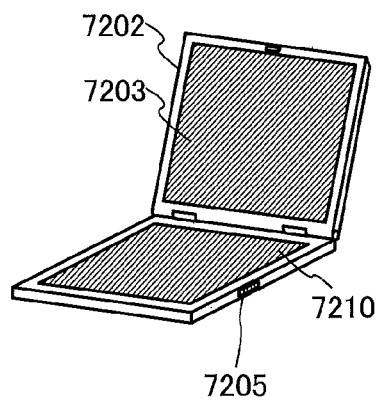

FIG. 8A illustrates an example of a television device. In the television device, a display portion 7103 is incorporated in a housing 7101. Here, the housing 7101 is supported by a stand 7105. Images can be displayed on the display portion 7103, and in the display portion 7103, the light-emitting elements described in Embodiment 1 or 2 are arranged in a matrix. The light-emitting element can have high emission efficiency. Furthermore, the light-emitting element can have a long lifetime. Therefore, the television device including the display portion 7103 which is formed using the light-emitting element can exhibit reduced power consumption. Furthermore, the television device can have high reliability.

Operation of the television device can be performed with an operation switch of the housing 7101 or a separate remote controller 7110. With operation keys 7109 of the remote controller 7110, channels and volume can be controlled and images displayed on the display portion 7103 can be controlled. The remote controller 7110 may be provided with a display portion 7107 for displaying data output from the remote controller 7110.

Note that the television device is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

Figure 2:
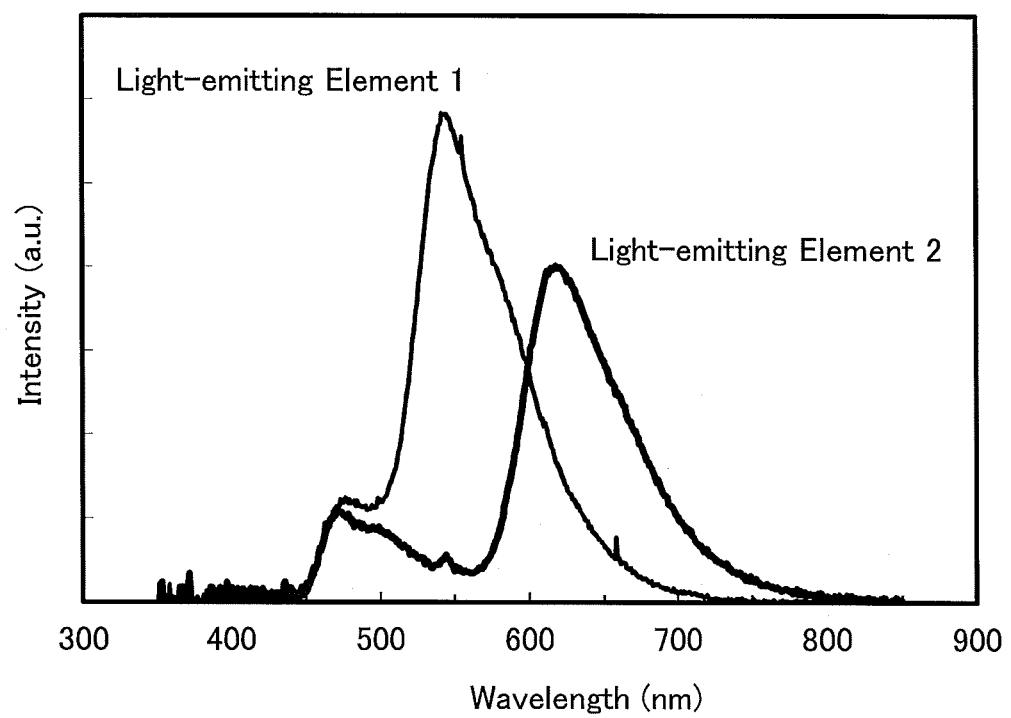
FIG. 2 shows emission spectra of a light-emitting element 1 and a light-emitting element 2.

FIG. 8B1 illustrates a computer, which includes a main body 7201, a housing 7202, a display portion 7203, a keyboard 7204, an external connection port 7205, a pointing device 7206, and the like. Note that this computer is manufactured by arranging the light-emitting elements described in Embodiment 1 or 2 in a matrix in the display portion 7203. The computer illustrated in FIG. 8B1 may have a structure illustrated in FIG. 8B2. The computer illustrated in FIG. 8B2 is provided with a second display portion 7210 instead of the keyboard 7204 and the pointing device 7206. The second display portion 7210 has a touch screen, and input can be performed by operation of images, which are displayed on the second display portion 7210, with a finger or a dedicated pen. The second display portion 7210 can also display images other than the display for input. The display portion 7203 may also have a touch screen. Connecting the two screens with a hinge so that the computer becomes foldable can prevent troubles; for example, the screens can be prevented from being cracked or broken while the computer is being stored or carried. The light-emitting elements can have high emission efficiency. Therefore, this computer having the display portion 7203 which is formed using the light-emitting elements can have reduced power consumption.

Figure 8C:
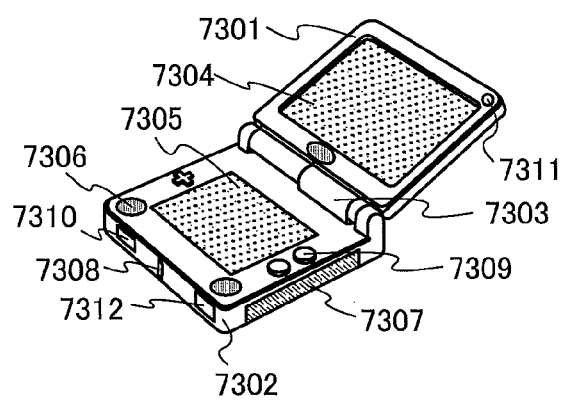

FIG. 8C illustrates a portable game machine having two housings, a housing 7301 and a housing 7302, which are connected with a joint portion 7303 so that the portable game machine can be opened or folded. The housing 7301 incorporates a display portion 7304 including the light-emitting elements described in Embodiment 1 or 2 and arranged in a matrix, and the housing 7302 incorporates a display portion 7305. In addition, the portable game machine illustrated in FIG. 8C includes a speaker portion 7306, a recording medium insertion portion 7307, an LED lamp 7308, input means (an operation key 7309, a connection terminal 7310, a sensor 7311 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the display portion which includes the light-emitting elements described in Embodiment 1 or 2 and arranged in a matrix is used as either the display portion 7304 or the display portion 7305, or both, and the structure can include other accessories as appropriate. The portable game machine illustrated in FIG. 8C has a function of reading out a program or data stored in a storage medium to display it on the display portion, and a function of sharing information with another portable game machine by wireless communication. Note that functions of the portable game machine illustrated in FIG. 8C are not limited to them, and the portable game machine can have various functions. Since the light-emitting elements used in the display portion 7304 have high emission efficiency, the portable game machine including the above-described display portion 7304 can have reduced power consumption. Furthermore, since the light-emitting elements used in the display portion 7304 each have a long lifetime, the portable game machine can have high reliability.

Figure 8D:
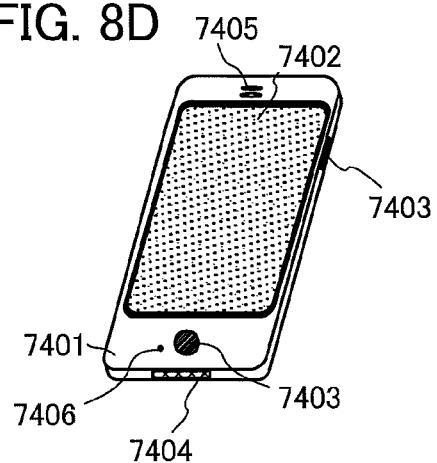

FIG. 8D illustrates an example of a mobile phone. The mobile phone is provided with a display portion 7402 incorporated in a housing 7401, operation buttons 7403, an external connection port 7404, a speaker 7405, a microphone 7406, and the like. Note that the mobile phone has the display portion 7402 including the light-emitting elements described in Embodiment 1 or 2 and arranged in a matrix. The light-emitting elements can have high emission efficiency. Therefore, the mobile phone including the display portion 7402 which is formed using the light-emitting elements can have reduced power consumption. Furthermore, the mobile phone can have high reliability.

When the display portion 7402 of the mobile phone illustrated in FIG. 8D is touched with a finger or the like, data can be input into the mobile phone. In this case, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting information such as characters. The third mode is a display-and-input mode in which two modes of the display mode and the input mode are combined.

For example, in the case of making a call or creating an e-mail, a character input mode is selected for the display portion 7402 so that characters can be input on a screen. In this case, it is preferable to display a keyboard or number buttons on the screen of the display portion 7402.

When a sensing device including a sensor such as a gyroscope or an acceleration sensor for detecting inclination is provided inside the mobile phone, display on the screen can be automatically changed in direction by determining the orientation of the mobile phone (whether the mobile phone is placed horizontally or vertically).

The screen modes are switched by touch on the display portion 7402 or operation with the operation buttons 7403. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

In the input mode, when input by touching the display portion 7402 is not performed for a certain period, the screen mode may be controlled so as to be switched from the input mode to the display mode. Note that the touching operation may be sensed by an optical sensor in the display portion 7402.

The display portion 7402 may function as an image sensor. For example, an image of a palm print, a fingerprint, or the like is taken by the display portion 7402 while in touch with the palm or the finger, whereby personal authentication can be performed. Further, by providing a backlight or a sensing light source which emits a near-infrared light in the display portion, an image of a finger vein, a palm vein, or the like can be taken.

Figure 9:
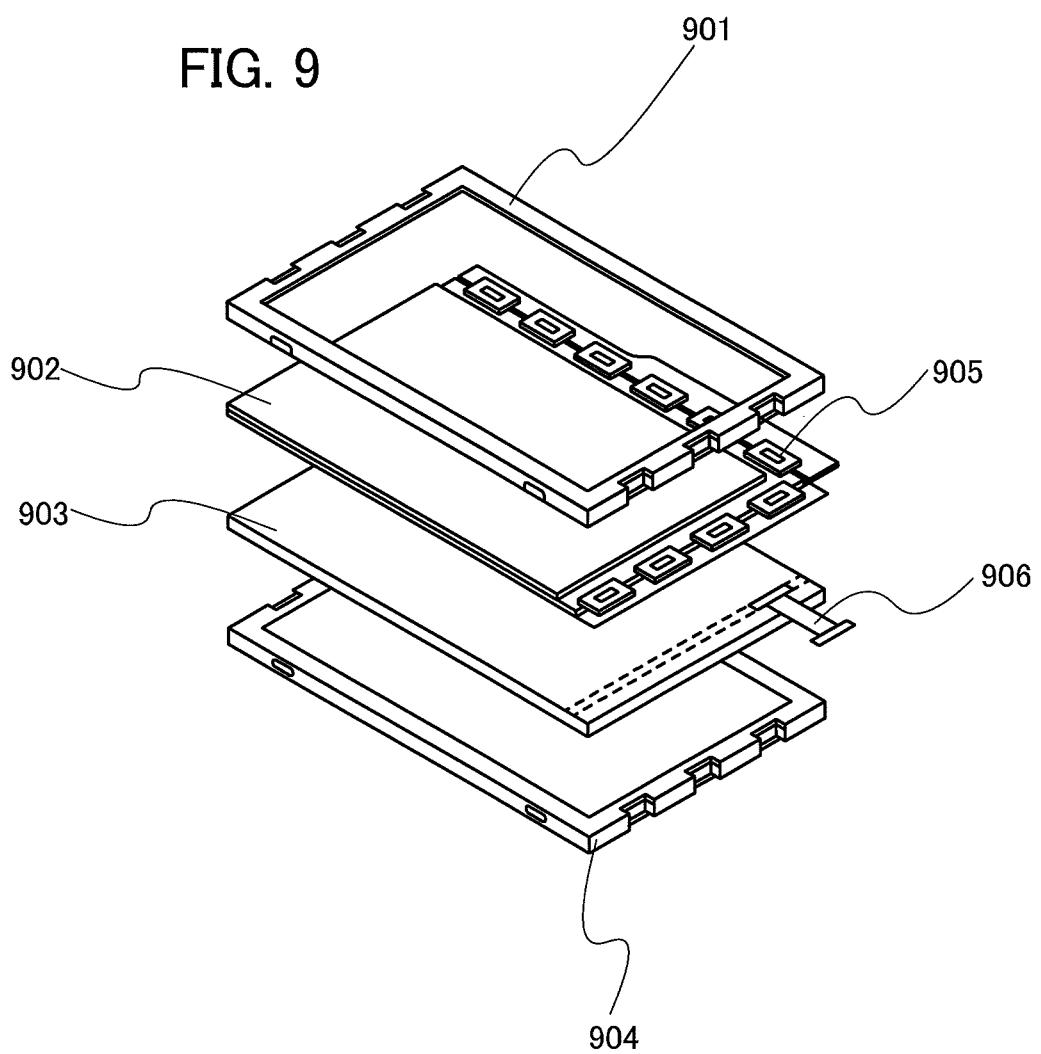
FIG. 9 illustrates an electronic device.

FIG. 9 illustrates an example of a liquid crystal display device using the light-emitting element described in Embodiment 1 or 2 for a backlight. The liquid crystal display device illustrated in FIG. 9 includes a housing 901, a liquid crystal layer 902, a backlight unit 903, and a housing 904. The liquid crystal layer 902 is connected to a driver IC 905. To the backlight unit 903 is supplied current through a terminal 906.

The light-emitting element described in Embodiment 1 or 2 is used for the backlight of the liquid crystal display device; thus, the backlight can have reduced power consumption. In addition, the use of the light-emitting element enables manufacture of a planar-emission lighting device and further a larger-area planar-emission lighting device; therefore, the backlight can be a larger-area backlight, and the liquid crystal display device can also be a larger-area device. Furthermore, the light-emitting device can be thinner than a conventional one; accordingly, the display device can also be thinner.

Figure 12:
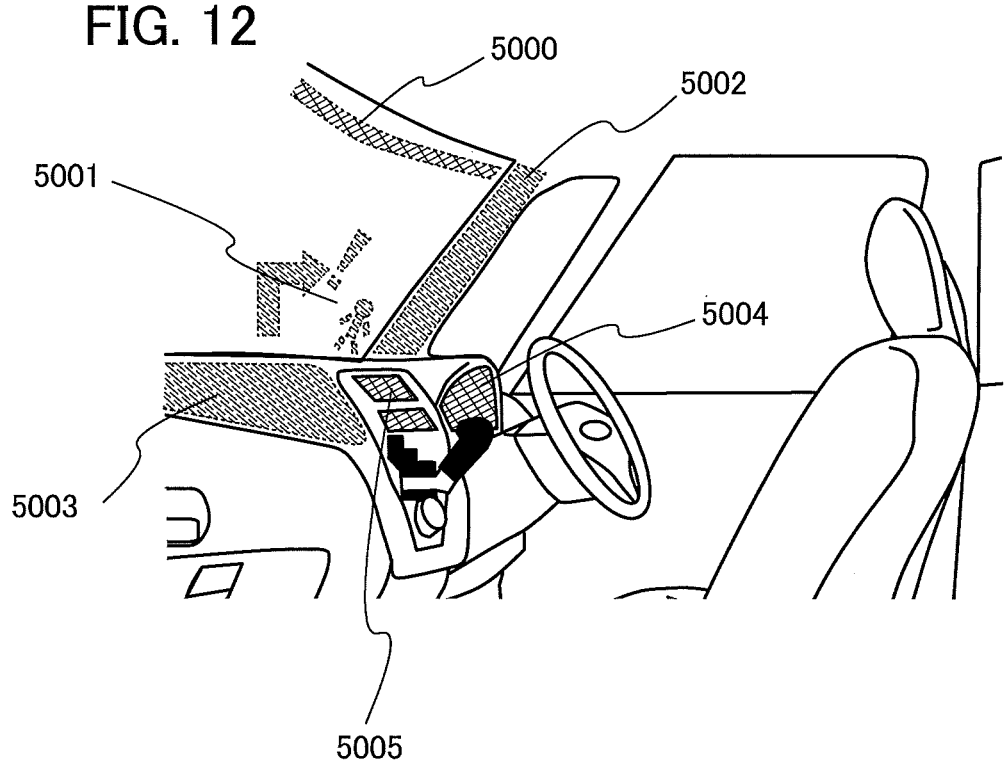
FIG. 12 illustrates in-vehicle display devices and lighting devices.

The light-emitting element described in Embodiment 1 or 2 can also be used for an automobile windshield or an automobile dashboard. FIG. 12 illustrates one mode in which the light-emitting elements described in Embodiment 1 or 2 are used for an automobile windshield and an automobile dashboard. Displays 5000 to 5005 each include the light-emitting element described in Embodiment 1 or 2.

The display 5000 and the display 5001 are provided in the automobile windshield in which the light-emitting elements described in Embodiment 1 or 2 are incorporated. The light-emitting element described in Embodiment 1 or 2 can be formed into what is called a see-through display device, through which the opposite side can be seen, by including a first electrode and a second electrode formed of electrodes having light-transmitting properties. Such see-through display devices can be provided even in the automobile windshield, without hindering the vision. Note that in the case where a transistor for driving or the like is provided, a transistor having a light-transmitting property, such as an organic transistor using an organic semiconductor material or a transistor using an oxide semiconductor, is preferably used.

The display 5002 is provided in a pillar portion in which the light-emitting elements described in Embodiment 1 or 2 are incorporated. The display 5002 can compensate for the view hindered by the pillar portion by showing an image taken by an imaging unit provided in the car body. Similarly, the display 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see makes it possible for the driver to confirm safety easily and comfortably.

The display 5004 and the display 5005 can provide a variety of kinds of information such as navigation data, speed, axial rotation speed of an engine, a mileage, a fuel level, a gearshift state, and air-condition setting. The content or layout of the display can be changed freely by a user as appropriate. Note that such information can also be shown by the displays 5000 to 5003. The displays 5000 to 5005 can also be used as lighting devices.

The light-emitting element described in Embodiment 1 or 2 can have high emission efficiency and low power consumption. Therefore, load on a battery is small even when a number of large screens such as the displays 5000 to 5005 are provided, which provides comfortable use. For that reason, the light-emitting device and the lighting device each of which includes the light-emitting element described in Embodiment 1 or 2 can be suitably used as an in-vehicle light-emitting device and an in-vehicle lighting device.

FIGS. 13A and 13B illustrate an example of a foldable tablet terminal. FIG. 13A illustrates the tablet terminal which is unfolded. The tablet terminal includes a housing 9630, a display portion 9631a, a display portion 9631b, a display mode switch 9034, a power switch 9035, a power-saving mode switch 9036, a clasp 9033, and an operation switch 9038. Note that in the tablet terminal, one or both of the display portion 9631a and the display portion 9631b is/are formed using a light-emitting device which includes the light-emitting element described in Embodiment 1 or 2.

Part of the display portion 9631a can be a touchscreen region 9632a and data can be input when a displayed operation key 9637 is touched. Although half of the display portion 9631a has only a display function and the other half has a touchscreen function, one embodiment of the present invention is not limited to the structure. The whole display portion 9631a may have a touchscreen function. For example, a keyboard can be displayed on the entire region of the display portion 9631a so that the display portion 9631a is used as a touchscreen, and the display portion 9631b can be used as a display screen.

Like the display portion 9631a, part of the display portion 9631b can be a touchscreen region 9632b. When a switching button 9639 for showing/hiding a keyboard on the touchscreen is touched with a finger, a stylus, or the like, the keyboard can be displayed on the display portion 9631b.

Touch input can be performed in the touchscreen region 9632a and the touchscreen region 9632b at the same time.

The display mode switch 9034 can switch the display between portrait mode, landscape mode, and the like, and between monochrome display and color display, for example. The power-saving mode switch 9036 can control display luminance in accordance with the amount of external light in use of the tablet terminal sensed by an optical sensor incorporated in the tablet terminal. Another sensing device including a sensor such as a gyroscope or an acceleration sensor for sensing inclination may be incorporated in the tablet terminal, in addition to the optical sensor.

Although FIG. 13A illustrates an example in which the display portion 9631a and the display portion 9631b have the same display area, one embodiment of the present invention is not limited to the example. The display portion 9631a and the display portion 9631b may have different display areas and different display quality. For example, higher definition images may be displayed on one of the display portions 9631*a* and 9631*b*.

FIG. 13B illustrates the tablet terminal which is folded. The tablet terminal in this embodiment includes the housing 9630, a solar cell 9633, a charge and discharge control circuit 9634, a battery 9635 and a DC-to-DC converter 9636.

Since the tablet terminal is foldable, the housing 9630 can be closed when the tablet terminal is not in use. As a result, the display portion 9631*a* and the display portion 9631*b* can be protected, thereby providing a tablet terminal with high endurance and high reliability for long-term use.

The tablet terminal illustrated in FIGS. 13A and 13B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touchscreen, the display portion, a video signal processing portion, or the like. Note that the solar cell 9633 can be provided on one or both surfaces of the housing 9630, so that the battery 9635 can be charged efficiently.

The structure and operation of the charge and discharge control circuit 9634 illustrated in FIG. 13B will be described with reference to a block diagram of FIG. 13C. FIG. 13C illustrates the solar cell 9633, the battery 9635, the DC-to-DC converter 9636, a converter 9638, switches SW1 to SW3, and a display portion 9631. The battery 9635, the DC-to-DC converter 9636, the converter 9638, and the switches SW1 to SW3 correspond to the charge and discharge control circuit 9634 illustrated in FIG. 13B.

First, description is made on an example of the operation in the case where power is generated by the solar cell 9633 with the use of external light. The voltage of the power generated by the solar cell is raised or lowered by the DC-to-DC converter 9636 so as to be voltage for charging the battery 9635. Then, when power from the solar cell 9633 is used for the operation of the display portion 9631, the switch SW1 is turned on and the voltage of the power is raised or lowered by the converter 9638 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation means, the power generation means is not particularly limited, and the battery 9635 may be charged by another power generation means such as a piezoelectric element or a thermoelectric conversion element (Peltier element). The battery 9635 may be charged by a non-contact power transmission module capable of performing charging by transmitting and receiving power wirelessly (without contact), or any of the other charge means used in combination, and the power generation means is not necessarily provided.

One embodiment of the present invention is not limited to the tablet terminal having the shape illustrated in FIGS. 13A to 13C as long as the display portion 9631 is included.

As described above, the application range of the light-emitting device having the light-emitting element described in Embodiment 1 or 2 is wide so that this light-emitting device can be applied to electronic devices in a variety of fields. By using the light-emitting element described in Embodiment 1 or 2, an electronic device having reduced power consumption can be obtained.

REFERENCE EXAMPLE

In this reference example, characteristics of the light-emitting unit described in Embodiment 1 and Embodiment 2 are described. Structural formulae of organic compounds used in this reference example are shown below.

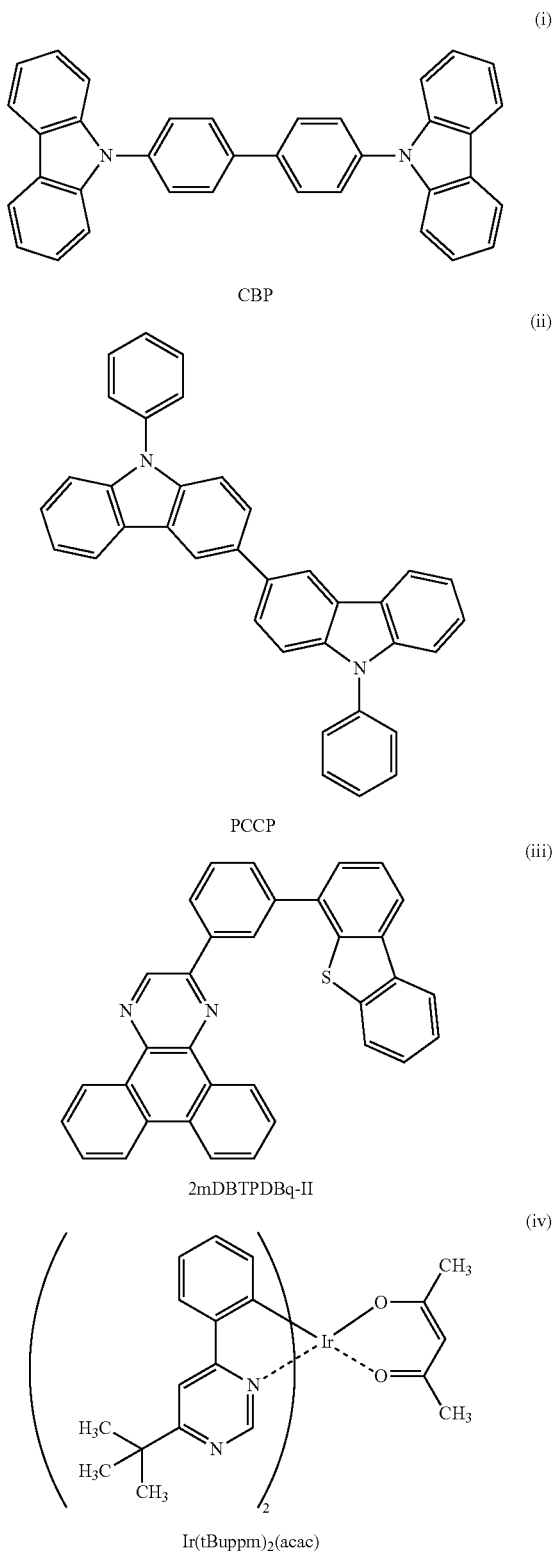

(v)

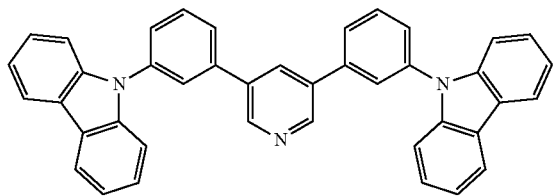

3,5DCzPPy (vi)

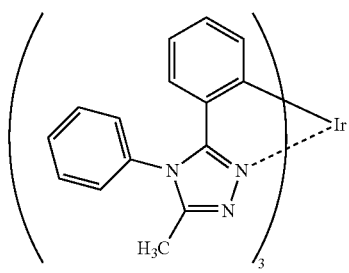

Ir(Mptz)₃

(vii)

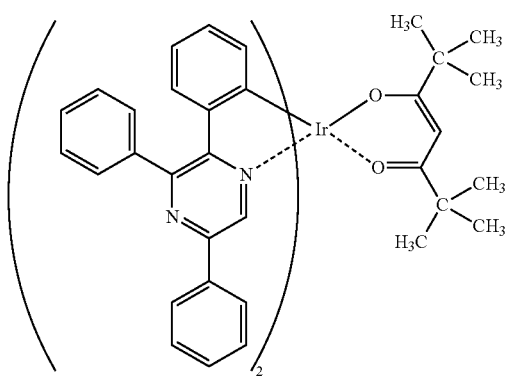

Ir(tppr)₂(dpm)

(viii)

BPhen

Next, methods for fabricating a light-emitting element 1 and a light-emitting element 2 in this reference example are described below.

First, a film of indium tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 functions as an anode of the light-emitting element.

Next, as pretreatment for forming the light-emitting element over the substrate, UV-ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, over the first electrode 101, CBP represented by Structural Formula (1) and molybdenum(VI) oxide were deposited by co-evaporation, so that the hole-injection layer was formed. The thickness of the hole-injection layer was set to 50 nm, and the weight ratio of CBP to molybdenum oxide was adjusted to 4:2. Note that the co-evaporation method refers to an evaporation method in which evaporation is carried out from a plurality of evaporation sources at the same time in one treatment chamber.

Next, a film of PCCP which is represented by Structural Formula (ii) was formed to a thickness of 20 nm over the hole-injection layer to form the hole-transport layer.

Further, over the hole-transport layer, the light-emitting layer was formed by co-evaporation of 2mDBTPDBq-II represented by Structural Formula (iii), PCCP, and Ir(tBuppm)₂(acac) represented by Structural Formula (Iv) to a thickness of 20 nm with a weight ratio of 1:0.3:0.06 (=2mDBTPDBq-II: PCCP: Ir(tBuppm)₂(acac)), co-evaporation of 35DCzPPy represented by Structural Formula (v), PCCP, and Ir(Mptz)₃ represented by Structural Formula (vi) to a thickness of 20 nm with a weight ratio of 1:1:0.06 (=35DCzPPy:PCCP:Ir(Mptz)₃), and then co-evaporation of 35DCzPPy and Ir(Mptz)₃ to a thickness of 10 nm with a weight ratio of 1:0.06 (=35DCzPPy:Ir(Mptz)₃). Note that 2mDBTPDBq-II, which is a host material, and PCCP, which is a third substance, form an exciplex, and 35DCzPPy, which is a host material, and PCCP, which is the third substance, form an exciplex.

Then, the electron-transport layer was formed over the light-emitting layer in such a way that a 10 nm thick film of 35DCzPPy was formed and a 15 nm thick film of BPhen represented by Structural Formula (viii) was formed.

After the formation of the electron-transport layer, lithium fluoride was deposited by evaporation to a thickness of 1 nm, so that the electron-injection layer was formed.

Lastly, aluminum was deposited by evaporation to a thickness of 200 nm to form the second electrode 102 functioning as a cathode. Thus, the light-emitting element 1 in this reference example was fabricated.

The light-emitting element 2 was fabricated in the same manner as the light-emitting element 1, except that the light-emitting layer was formed as follows.

After the hole-transport layer was formed, the light-emitting layer was formed by co-evaporation of 2mDBTPDBq-II, PCCP, and Ir(tppr)₂(dpm) represented by Structural Formula (vii) to a thickness of 20 nm with a weight ratio of 0.7:0.3:0.06 (=2mDBTPDBq-II:PCCP:Ir(tppr)₂(dpm)), co-evaporation of 35DCzPPy, PCCP, and Ir(Mptz)₃ to a thickness of 20 nm with a weight ratio of 0.7:0.3:0.06 (=35DCzPPy:PCCP:Ir(Mptz)₃), and then co-evaporation of 35DCzPPy and Ir(Mptz)₃ to a thickness of 10 nm with a weight ratio of 1:0.06 (=35DCzPPy:Ir(Mptz)₃).

Note that in all the above evaporation steps, evaporation was performed by a resistance-heating method.

Tables 1 and 2 show element structures of the light-emitting elements 1 and 2.

TABLE 1

Structure of the Light-emitting Element 1

| Hole-injection layer | Hole-transport layer | Light-emitting layer | | | Electron-transport layer | | Electron-injection layer |
|---|---|---|---|---|---|---|---|
| | | First | Second | Third | | | |
| CBP:MoOx (4:2) 50 nm | PCCP 20 nm | 2mDBTPDBq-II: PCCP:Ir(tBuppm)$_2$(acac) (1:0.3:0.06) 20 nm | 35DCzPPy: PCCP:Ir(Mptz)$_3$ (1:1:0.06) 20 nm | 35DCzPPy: Ir(Mptz)$_3$ (1:0.06) 10 nm | 35DCzPPy 10 nm | Bphen 15 nm | LiF 1 nm |

TABLE 2

Structure of the Light-emitting Element 2

| Hole-injection layer | Hole-transport layer | Light-emitting layer | | | Electron-transport layer | | Electron-injection layer |
|---|---|---|---|---|---|---|---|
| | | First | Second | Third | | | |
| CBP:MoOx (4:2) 50 nm | PCCP 20 nm | 2mDBTPDBq-II: PCCP:Ir(tppr)$_2$(dpm) (0.7:0.3:0.06) 20 nm | 35DCzPPy: PCCP:Ir(Mptz)$_3$ (0.7:0.3:0.06) 20 nm | 35DCzPPy: Ir(Mptz)$_3$ (1:0.06) 10 nm | 35DCzPPy 10 nm | Bphen 15 nm | LiF 1 nm |

Table 3 shows main characteristics of the light-emitting elements 1 and 2 at around 1000 cd/m$^2$.

TABLE 3

Properties of the Light-emitting Elements 1 and 2

| Light-emitting element | Voltage (V) | Chromaticity | | Current efficiency (cd/A) | Power efficiency (lm/W) | Quantum efficiency (%) |
|---|---|---|---|---|---|---|
| | | x | y | | | |
| 1 | 4.6 | 0.36 | 0.53 | 58 | 39 | 18 |
| 2 | 4.6 | 0.50 | 0.33 | 19 | 13 | 15 |

FIG. 2 shows emission spectra of the light-emitting elements 1 and 2. In each of the light-emitting elements 1 and 2, the peak intensity in a blue region (400 nm to 500 nm) is about 20% of the peak intensity in the other wavelength region (500 nm to 700 nm), which means that a load on a blue phosphorescent substance is light. In the light-emitting elements 1 and 2, the light-emitting units are stacked with a charge generation layer provided therebetween. In the light-emitting element of one embodiment of the present invention, the blue-region emission is integrated. Hence, when two light-emitting units are used, the emission intensity in the blue region is approximately 40% of whole of the emission intensity.

In this manner, by application of one embodiment of the present invention, a load on a blue phosphorescent substance with low resistance can be reduced, and a light-emitting element having a long lifetime can be obtained. In the light-emitting element, all light-emitting substances are phosphorescent substances. Thus, the light-emitting element can have high emission efficiency. In addition, the structure is suitable for obtaining white light emission, and by application of one embodiment of the present invention, a light-emitting element having high emission efficiency and a long lifetime can be easily provided.

This application is based on Japanese Patent Application serial no. 2012-126198 filed with Japan Patent Office on Jun. 1, 2012, the entire contents of which are hereby incorporated by reference.

What is claimed is:

1. A light-emitting element comprising:
   a first electrode;
   a first light-emitting unit over the first electrode, the first light-emitting unit comprising a first light-emitting layer;
   a second light-emitting unit over the first light-emitting unit, the second light-emitting unit comprising a second light-emitting layer; and
   a second electrode over the second light-emitting unit,
   wherein:
   the first light-emitting layer comprises:
      a first layer comprising a first host material and a first phosphorescent substance which exhibits a maximum emission peak in a range from 500 nm to 700 nm; and
      a second layer in contact with the first layer, the second layer comprising a second host material and a second phosphorescent substance which exhibits a maximum emission peak in a range from 400 nm to 500 nm;
   the second light-emitting layer comprises:
      a third layer comprising a third host material and a third phosphorescent substance which exhibits a maximum emission peak in a range from 500 nm to 700 nm and is different from the first phosphorescent substance; and
      a fourth layer in contact with the third layer, the fourth layer comprising a fourth host material and a fourth phosphorescent substance which exhibits a maximum emission peak in a range from 400 nm to 500 nm;
   at least one of the first to fourth layers further comprises an additive; and
   the additive is capable of forming an exciplex with at least one of the first to fourth host materials which is included in the one of the first to fourth layers.

2. The light-emitting element according to claim 1, further comprising a charge generation layer between the first and second light-emitting units.

3. The light-emitting element according to claim 1, wherein the first phosphorescent substance is the same as the second phosphorescent substance.

4. The light-emitting element according to claim 1, wherein an emission of the exciplex overlaps with an absorption band of the one of the first to fourth host materials, and
wherein the absorption band is located on the longest wavelength side among other absorption bands of the one of the first to fourth host materials.

5. The light-emitting element according to claim 1, wherein one of the first and second phosphorescent substances exhibits the maximum emission peak in a range from 500 nm to 600 nm, and
wherein the other of the first and second phosphorescent substances exhibits the maximum emission peak in a range from 600 nm to 700 nm.

6. An electronic device comprising the light-emitting element according to claim 1.

7. A lighting device comprising the light-emitting element according to claim 1.

8. A display device comprising:
first to third pixels each comprising:
a transistor;
a coloring layer whose color is different from pixel to pixel; and
a first electrode electrically connected to the transistor;
an EL layer extending over and shared by the first to third pixels; and
a second electrode over the EL layer and shared by the first to third pixels,
wherein the EL layer comprises a first light-emitting unit comprising a first light-emitting layer and a second light-emitting unit comprising a second light-emitting layer,
wherein:
the first light-emitting layer comprises:
a first layer comprising a first host material and a first phosphorescent substance which exhibits a maximum emission peak in a range from 500 nm to 700 nm; and
a second layer in contact with the first layer, the second layer comprising a second host material and a second phosphorescent substance which exhibits a maximum emission peak in a range from 400 nm to 500 nm;
the second light-emitting layer comprises:
a third layer comprising a third host material and a third phosphorescent substance which exhibits a maximum emission peak in a range from 500 nm to 700 nm and is different from the first phosphorescent substance; and
a fourth layer in contact with the third layer, the fourth layer comprising a fourth host material and a fourth phosphorescent substance which exhibits a maximum emission peak in a range from 400 nm to 500 nm;
at least one of the first to fourth layers further comprises an additive; and
the additive is capable of forming an exciplex with at least one of the first to fourth host materials which is included in the one of the first to fourth layers.

9. The display device according to claim 8, further comprising a charge generation layer between the first and second light-emitting units.

10. The display device according to claim 8, wherein the first phosphorescent substance is the same as the second phosphorescent substance.

11. The display device according to claim 8, wherein an emission of the exciplex overlaps with an absorption band of the one of the first to fourth host materials, and
wherein the absorption band is located on the longest wavelength side among other absorption bands of the one of the first to fourth host materials.

12. The display device according to claim 8, wherein one of the first and second phosphorescent substances exhibits the maximum emission peak in a range from 500 nm to 600 nm, and
wherein the other of the first and second phosphorescent substances exhibits the maximum emission peak in a range from 600 nm to 700 nm.

13. An electronic device comprising the display device according to claim 8.

14. A display device comprising:
first to fourth pixels each comprising:
a transistor; and
a first electrode electrically connected to the transistor;
first to third coloring layers included in the first to third pixels, respectively;
an EL layer extending over and shared by the first to fourth pixels; and
a second electrode over the EL layer and shared by the first to fourth pixels,
wherein the EL layer comprises a first light-emitting unit comprising a first light-emitting layer and a second light-emitting unit comprising a second light-emitting layer,
wherein:
the first light-emitting layer comprises:
a first layer comprising a first host material and a first phosphorescent substance which exhibits a maximum emission peak in a range from 500 nm to 700 nm; and
a second layer in contact with the first layer, the second layer comprising a second host material and a second phosphorescent substance which exhibits a maximum emission peak in a range from 400 nm to 500 nm;
the second light-emitting layer comprises:
a third layer comprising a third host material and a third phosphorescent substance which exhibits a maximum emission peak in a range from 500 nm to 700 nm and is different from the first phosphorescent substance; and
a fourth layer in contact with the third layer, the fourth layer comprising a fourth host material and a fourth phosphorescent substance which exhibits a maximum emission peak in a range from 400 nm to 500 nm;
at least one of the first to fourth layers further comprises an additive; and
the additive is capable of forming an exciplex with at least one of the first to fourth host materials which is included in the one of the first to fourth layers.

15. The display device according to claim 14, wherein emissions from the first to third pixels are extracted through the first to third coloring layers, respectively, while an emission from the fourth pixel is extracted as a white light.

16. The display device according to claim 14, further comprising a charge generation layer between the first and second light-emitting units.

17. The display device according to claim 14,
wherein the first phosphorescent substance is the same as the second phosphorescent substance.

18. The display device according to claim 14,
wherein an emission of the exciplex overlaps with an absorption band of the one of the first to fourth host materials, and
wherein the absorption band is located on the longest wavelength side among other absorption bands of the one of the first to fourth host materials.

19. The display device according to claim 14,
wherein one of the first and second phosphorescent substances exhibits the maximum emission peak in a range from 500 nm to 600 nm, and
wherein the other of the first and second phosphorescent substances exhibits the maximum emission peak in a range from 600 nm to 700 nm.

20. An electronic device comprising the display device according to claim 14.

* * * * *